(12) United States Patent
Qing

(10) Patent No.: US 12,283,239 B2
(45) Date of Patent: Apr. 22, 2025

(54) DRIVING CIRCUIT, DRIVING METHOD AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventor: Haigang Qing, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 18/005,955

(22) PCT Filed: Jan. 13, 2022

(86) PCT No.: PCT/CN2022/071752
§ 371 (c)(1),
(2) Date: Jan. 18, 2023

(87) PCT Pub. No.: WO2023/133753
PCT Pub. Date: Jul. 20, 2023

(65) Prior Publication Data
US 2024/0249676 A1    Jul. 25, 2024

(51) Int. Cl.
*G09G 3/3233*    (2016.01)
*G09G 3/3266*    (2016.01)

(52) U.S. Cl.
CPC ......... *G09G 3/3233* (2013.01); *G09G 3/3266* (2013.01); *G09G 2300/0426* (2013.01);
(Continued)

(58) Field of Classification Search
CPC ............... G09G 3/3233; G09G 3/3266; G09G 2300/0426; G09G 2300/0819; G09G 2300/0852; G09G 2310/0286
See application file for complete search history.

(56) References Cited

U.S. PATENT DOCUMENTS 8,040,297 B2    10/2011  Chung
2007/0024544 A1   2/2007  Chung et al.
(Continued)

FOREIGN PATENT DOCUMENTS

CN    1909042 A    2/2007
CN    103985352 A  8/2014
(Continued)

*Primary Examiner* — Temesghen Ghebretinsae
*Assistant Examiner* — Sosina Abebe
(74) *Attorney, Agent, or Firm* — McCoy Russell LLP

(57) ABSTRACT

A driving circuit, a driving method and a display device are provided. The driving circuit includes a plurality of stages of scanning driving circuits and a plurality of rows of pixel driving circuits; wherein at least one stage of scanning driving circuit includes a driving signal output terminal, and the driving signal output terminal is electrically connected to at least three adjacent rows of pixel driving circuits in the plurality of rows of pixel driving circuits, and is configured to provide a compensation control signal, a data writing-in control signal and a reset control signal to the at least three adjacent rows of pixel driving circuits.

18 Claims, 14 Drawing Sheets

(52) U.S. Cl.
CPC ............ *G09G 2300/0819* (2013.01); *G09G 2300/0852* (2013.01); *G09G 2310/0286* (2013.01)

(56) References Cited

U.S. PATENT DOCUMENTS

| | | |
|---|---|---|
| 2008/0055505 A1 | 3/2008 | Yeh et al. |
| 2011/0157125 A1 | 6/2011 | Choi |
| 2015/0348462 A1 | 12/2015 | Ma |
| 2016/0365035 A1 | 12/2016 | Park |
| 2017/0069262 A1 | 3/2017 | Wu et al. |
| 2018/0006099 A1 | 1/2018 | Ka et al. |
| 2018/0033365 A1 | 2/2018 | Zhang et al. |
| 2020/0388223 A1 | 12/2020 | Wang |
| 2022/0319414 A1 | 10/2022 | Jin et al. |

FOREIGN PATENT DOCUMENTS

| | | | |
|---|---|---|---|
| CN | 203812537 U | | 9/2014 |
| CN | 105096819 A | | 11/2015 |
| CN | 105788529 A | | 7/2016 |
| CN | 108389549 A | | 8/2018 |
| CN | 112002283 A | | 11/2020 |
| CN | 112509517 A | | 3/2021 |
| CN | 113436583 A | * | 9/2021 |
| CN | 113870789 A | | 12/2021 |

* cited by examiner

DRIVING CIRCUIT, DRIVING METHOD AND DISPLAY DEVICE

CROSS REFERENCE TO RELATED APPLICATION

This application is the U.S. national phase of PCT Application No. PCT/CN2022/071752 filed on Jan. 13, 2022, which is incorporated herein by reference in its entirety.

TECHNICAL FIELD

The present disclosure relates to the field of display technology, in particular to a driving circuit, a driving method and a display device.

BACKGROUND

When the related AMOLED display device is in operation, in the case of high-frequency frames, due to insufficient charging time, the threshold voltage of the driving transistor included in the driving circuit in the pixel circuit cannot be fully compensated, resulting in uneven display. When displaying low-grayscale images, the problem of uneven image quality will be more obvious.

SUMMARY

In one aspect, the present disclosure provides in some embodiments a driving circuit, including a plurality of stages of scanning driving circuits and a plurality of rows of pixel driving circuits; wherein at least one stage of scanning driving circuit includes a driving signal output terminal, and the driving signal output terminal is electrically connected to at least three adjacent rows of pixel driving circuits in the plurality of rows of pixel driving circuits, and is configured to provide a compensation control signal, a data writing-in control signal and a reset control signal to the at least three adjacent rows of pixel driving circuits.

Optionally, the driving circuit includes N+2 stages of scanning driving circuits and N rows of pixel driving circuits; N is an integer greater than 1; an nth stage of driving signal output terminal of an nth stage of scanning driving circuit included in the driving circuit is respectively electrically connected to an (n−2)th row of pixel driving circuit, an (n−1)th row of pixel driving circuit and an nth row of pixel driving circuit, the nth stage of scanning driving circuit is configured to provide the compensation control signal to the (n−2)th row of pixel driving circuit, provide the data writing-in control signal to the (n−1)th row of pixel driving circuit and provide the reset control signal to the nth row of pixel driving circuit through the nth stage of driving signal output terminal; n is a positive integer, n is greater than 2, and n is less than N+1.

Optionally, a first stage of driving signal output terminal of a first stage of scanning driving circuit included in the driving circuit is electrically connected to a first row of pixel driving circuit, and the first stage of scanning driving circuit is configured to providing the reset control signal to the first row of pixel driving circuit through the first stage of driving signal output terminal; an (N+2)th stage of driving signal output terminal of an (N+2)th stage of scanning driving circuit included in the driving circuit is electrically connected to the Nth row of pixel driving circuit, and the (N+2)th stage of scanning driving circuit is configured to provide the compensation control signal to the Nth row of pixel driving circuit through the (N+2)th stage of driving signal output terminal.

Optionally, a second stage of driving signal output terminal of a second stage of scanning driving circuit included in the driving circuit is respectively electrically connected to a first row of pixel driving circuit and a second row of pixel driving circuit, and the second stage of scanning driving circuit is configured to provide the data writing-in control signal to the first row of the pixel driving circuit, and provide the reset control signal to the second row of pixel driving circuit through the second stage of driving signal output terminal; an (N+1)th stage of driving signal output terminal of an (N+1)th stage of scanning driving circuit included in the driving circuit is electrically connected to an (N−1)th row of pixel driving circuit and an Nth row of pixel driving circuit respectively, and the (N+1)th stage of scanning driving circuit is configured to provide the compensation control signals to the (N−1)th row of pixel driving circuit and provide the data writing-in control signal to the Nth row of pixel driving circuit through the (N+1)th stage of driving signal output terminal.

Optionally, the pixel driving circuit comprises a driving sub-circuit, a data writing-in sub-circuit, a compensation sub-circuit, a first energy storage sub-circuit and a second energy storage sub-circuit; the data writing-in sub-circuit is electrically connected to a data writing-in control line, a compensation control line, a data line, and a first end of the driving sub-circuit, respectively, is configured to write a data voltage provided by the data line into the first end of the driving sub-circuit under the control of the data writing-in control signal provided by the data writing-in control line and the compensation control signal provided by the compensation control line; the compensation sub-circuit is electrically connected to the compensation control line, a control end of the driving sub-circuit, and a second end of the driving sub-circuit, is configured to control to connect the control end of the driving sub-circuit and the second end of the driving sub-circuit under the control of the compensation control signal; the first energy storage sub-circuit is electrically connected to the first end of the driving sub-circuit for storing electric energy; the second energy storage sub-circuit is electrically connected to the control end of the driving sub-circuit for storing electric energy.

Optionally, the pixel driving circuit further comprises a reset sub-circuit; the reset sub-circuit is electrically connected to the data writing-in control line, the reset control line, a first initial voltage line and the control end of the driving sub-circuit respectively, and is configured to write a first initial voltage provided by the first initial voltage line into the control end of the driving sub-circuit under the control of the data writing-in control signal and the reset control signal provided by the reset control line.

Optionally, the pixel driving circuit further comprises a reset sub-circuit; the reset sub-circuit is electrically connected to the reset control line, a first initial voltage line and the control end of the driving sub-circuit respectively, and is configured to write a first initial voltage provided by the first initial voltage line into the control end of the driving sub-circuit under the control of the reset control signal provided by the reset control line.

Optionally, the pixel driving circuit further comprises a first light emitting control sub-circuit, a second light emitting control sub-circuit and an initialization sub-circuit; the first light emitting control sub-circuit is electrically connected to a light emitting control line, a power supply voltage line and the first end of the driving sub-circuit respectively, and is configured to control to connect the power supply voltage line and the first end of the driving sub-circuit under the control of a light emitting control signal provided by the light emitting control line; the second light emitting control sub-circuit is electrically connected to the light emitting control line, the second end of the driving sub-circuit and a first electrode of the light emitting element, and is configured to control to connect the second end of the driving sub-circuit and the first electrode of the light emitting element, and connect a second electrode of the light emitting element and a first voltage terminal under the control of the light emitting control signal; the initialization sub-circuit is respectively electrically connected to the data writing-in control line, a second initial voltage line and the first electrode of the light emitting element, and is configured to write a second initial voltage provided by the second initial voltage line into the first electrode of the light emitting element under the control of the data writing-in control signal.

Optionally, the data writing-in sub-circuit includes a first transistor and a second transistor; the compensation sub-circuit includes a third transistor; a control electrode of the first transistor is electrically connected to the data writing-in control line, a first electrode of the first transistor is electrically connected to the data line, and a second electrode of the first transistor is electrically connected to a first electrode of the second transistor; a control electrode of the second transistor is electrically connected to the compensation control line, and a second electrode of the second transistor is electrically connected to the first end of the driving sub-circuit; a control electrode of the third transistor is electrically connected to the compensation control line, a first electrode of the third transistor is electrically connected to the control end of the driving sub-circuit, and a second electrode of the third transistor is electrically connected to the second end of the driving sub-circuit; the first energy storage sub-circuit includes a first capacitor; a first electrode plate of the first capacitor is electrically connected to the first end of the driving sub-circuit, and a second electrode plate of the first capacitor is electrically connected to the power supply voltage line.

Optionally, the reset sub-circuit includes a fourth transistor and a fifth transistor; a control electrode of the fourth transistor is electrically connected to the reset control line, a first electrode of the fourth transistor is electrically connected to the first initial voltage line, and a second electrode of the fourth transistor is electrically connected to a first electrode of the fifth transistor; a control electrode of the fifth transistor is electrically connected to the data writing-in control line, and a second electrode of the fifth transistor is electrically connected to the control end of the driving sub-circuit.

Optionally, the reset sub-circuit includes a fourth transistor; a control electrode of the fourth transistor is electrically connected to the reset control line, a first electrode of the fourth transistor is electrically connected to a first initial voltage line, and a second electrode of the fourth transistor is electrically connected to the control end of the driving sub-circuit.

Optionally, the first light emitting control sub-circuit includes a sixth transistor, the second light emitting control sub-circuit includes a seventh transistor, the initialization sub-circuit includes an eighth transistor, and the driving sub-circuit includes a driving transistor, the second energy storage sub-circuit includes a second capacitor; a control electrode of the sixth transistor is electrically connected to the light emitting control line, a first electrode of the sixth transistor is electrically connected to the power supply voltage line, and a second electrode of the sixth transistor is electrically connected to a first electrode of the driving transistor; a control electrode of the seventh transistor is electrically connected to the light emitting control line, a first electrode of the seventh transistor is electrically connected to a second electrode of the driving transistor, and a second electrode of the seventh transistor is electrically connected to a first electrode of the light emitting element; a control electrode of the eighth transistor is electrically connected to the data writing-in control line, a first electrode of the eighth transistor is electrically connected to a second initial voltage line, and a second electrode of the eighth transistor is electrically connected to the first electrode of the light emitting element; a first electrode plate of the second capacitor is electrically connected to a control electrode of the driving transistor, and a second electrode plate of the second capacitor is electrically connected to the power supply voltage line.

Optionally, the driving circuit further includes N rows of reset control lines, N rows of data writing-in control lines, and N rows of compensation control lines; the reset control lines, the data writing-in control lines and the compensation control lines all extending along a first direction, wherein the pixel driving circuit included in the driving circuit is electrically connected to a corresponding row of reset control line, a corresponding row of data writing-in control line and a corresponding row of compensation control line; each row of reset control line, each row of the data writing-in control line, and each row of the compensation control line extend to a peripheral area along the first direction, and in the peripheral area, an nth row of reset control line in, an (n−1)th row of data writing-in control line and an (n−2)th row of compensation control line are electrically connected; n is a positive integer, n is greater than 2, and n is less than N+1; N is an integer greater than 1.

Optionally, in the peripheral area, a first row of data writing-in control line is electrically connected to a second row of reset control line, and an Nth row of data writing-in control line is electrically connected to an (N−1)th row of the compensation control line.

Optionally, the driving circuit further includes N rows of light emitting control lines, wherein the pixel driving circuit included in the driving circuit is electrically connected to a corresponding row of light emitting control line; each row of pixel driving circuit includes a first transistor, a second transistor, a third transistor, a fourth transistor, a fifth transistor, a sixth transistor, a seventh transistor, an eighth transistor, a first capacitor and a second capacitor; a gate electrode of the fourth transistor and the corresponding row of reset control line form an integrated structure; a gate electrode of the eighth transistor and a next row of reset control line adjacent to the corresponding row of reset control line form an integrated structure; a gate electrode of the first transistor, a gate electrode of the fifth transistor and the corresponding row of data writing-in control line form an integrated structure; a first gate electrode of the third transistor, a second gate electrode of the third transistor, a gate electrode of the second transistor and the corresponding row of compensation control line form an integrated structure; a gate electrode of the sixth transistor, a gate electrode of the seventh transistor and the corresponding row of light emitting control line form an integrated structure; a gate electrode of the driving transistor is arranged between the corresponding row of compensation control line and the corresponding row of light emitting control line; the gate electrode of the driving transistor is multiplexed as a first electrode plate of the second capacitor; a second electrode plate of the second capacitor is multiplexed as a second electrode plate of the first capacitor; a drain electrode of the sixth transistor is multiplexed as a first electrode plate of the first capacitor; the corresponding row of reset control line, the corresponding row of data writing-in control line, the corresponding row of compensation control line and the corresponding row of light emitting control line electrically connected to a same row of pixel driving circuits are arranged in sequence along a second direction; the first direction intersects the second direction.

Optionally, an active layer of the fourth transistor, an active layer of the fifth transistor, an active layer of the third transistor, an active layer of the driving transistor, an active layer of the second transistor, an active layer of the first transistor, an active layer of the sixth transistor, an active layer of the seventh transistor, and an active layer of the eighth transistor are formed by a continuous semiconductor layer; a channel of the fourth transistor, a channel of the fifth transistor and a channel of the driving transistor are arranged in sequence along the second direction; a channel of the first transistor, a channel of the second transistor and a channel of the sixth transistor are arranged in sequence along the second direction.

Optionally, the driving circuit further includes N rows of second initial voltage lines, wherein the pixel driving circuit included in the driving circuit is electrically connected to a corresponding row of second initial voltage line; the second initial voltage line and the second electrode plate of the second capacitor are arranged at a same layer; an orthographic projection of the corresponding row of second initial voltage line on the base substrate is located on a side of an orthographic projection of the corresponding row of reset control line on the base substrate away from an orthographic projection of the corresponding row of data writing-in control line on the base substrate.

In a second aspect, an embodiment of the present disclosure provides a driving method for driving the driving circuit, includes: providing, by of at least one stage of the scanning driving circuit included in the driving circuit, the compensation control signal, the data writing-in control signal and the reset control signals to the at least three adjacent rows of pixel driving circuits through the driving signal output terminal.

In a third aspect, an embodiment of the present disclosure provides a display device including the driving circuit.

Optionally, the display device further includes a display substrate, wherein the pixel driving circuit included in the driving circuit is arranged in a display area of the display substrate, and the scanning driving circuit included in the driving circuit is arranged in a peripheral area of the display substrate.

DETAILED DESCRIPTION

Figure 1:
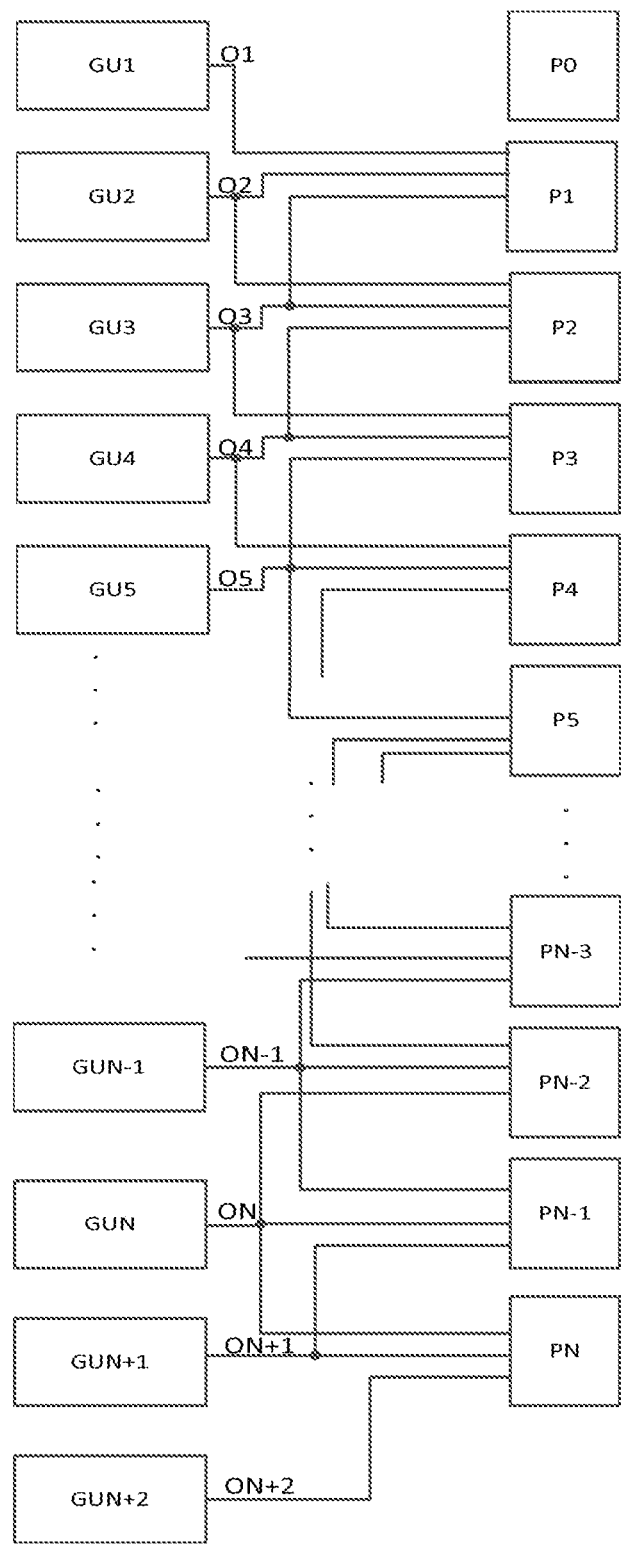
FIG. 1 is a structural diagram of a driving circuit according to at least one embodiment of the present disclosure.

The following will clearly and completely describe the technical solutions in the embodiments of the present disclosure with reference to the accompanying drawings. Apparently, the described embodiments are only some of the embodiments of the present disclosure, not all of them. Based on the embodiments in the present disclosure, all other embodiments obtained by a person skilled in the art without creative work belong to the protection scope of the present disclosure.

The transistors used in all the embodiments of the present disclosure may be triodes, thin film transistors or field effect transistors or other devices with the same characteristics. In the embodiments of the present disclosure, in order to distinguish the two electrodes of the transistor other the control electrode, one electrode is called the first electrode, and the other electrode is called the second electrode.

In actual operation, when the transistor is a thin film transistor or a field effect transistor, the first electrode may be a drain electrode, and the second electrode may be a source electrode; or, the first electrode may be a source electrode, or the second electrode may be a drain electrode.

The driving circuit described in the embodiment of the present disclosure includes a plurality of stages of scanning driving circuits and a plurality of rows of pixel driving circuits;

At least one stage of the scanning driving circuit includes a driving signal output terminal, and the driving signal output terminal is electrically connected to at least three adjacent rows of pixel driving circuits in the plurality of rows of pixel driving circuits, and is configured to provide a compensation control signal, a data writing-in control signal and a reset control signal for the at least three rows of pixel driving circuits.

In the driving circuit described in the embodiment of the present disclosure, at least one stage of scanning driving circuit of the driving circuit is electrically connected to at least three rows of adjacent pixel driving circuits through the driving signal output terminal thereof, and the scanning driving circuit is configured to respectively provide the compensation control signal, the data writing-in control signal and the reset control signal to the at least three rows of pixel driving circuits through the driving signal output terminal.

The driving circuit described in the embodiments of the present disclosure does not include an additional GOA (Gate On Array, gate driving circuit arranged on the array substrate) circuit unit, by partially overlapping among driving signals outputted by driving signal output terminals of adjacent stages of scanning driving circuits, the driving signal outputted by the current stage of the scanning driving circuit is used as the compensation control signal, the data writing-in control signal and the reset control signal provided to the adjacent at least three rows of pixel driving circuits, in this way, which not only ensures that the frame size of the display panel does not increase, and but also increases the compensation time of each row of pixel driving circuits, reduces the risk of mura (display unevenness), and doubles the display frequency frame when the compensation time is the same as that of the existing solution, greatly improves the display quality.

In at least one embodiment of the present disclosure, at least one stage of scanning driving circuits in the plurality of stages of scanning driving circuits may respectively include a corresponding stage of driving signal output terminal, and each corresponding stage of driving signal output terminal may be electrically connected to at least three adjacent rows of pixel driving circuits included in the driving circuit, to provide the compensation control signal, the data writing-in control signal and the reset control signal to the at least three rows of pixel driving circuits respectively.

In at least one embodiment of the present disclosure, half of the pulses of the driving signals outputted by the driving signal output terminals of adjacent rows of scanning driving circuits are in an overlapping state, but is not limited thereto.

In at least one embodiment of the present disclosure, although the pixel driving circuit uses an additional compensation control signal than the existing solutions, it does not need to add a new driving circuit. In at least one embodiment of the present disclosure, half of the pulses of the signals provided by adjacent rows of scanning driving circuits are in an overlapping state, and the scan driving module needs to use four clock signals to generate signals.

Optionally, the scan driving module includes an N+2 stages of scanning driving circuits, and the driving circuit includes N rows of pixel driving circuits; N is an integer greater than 1;

The nth stage of driving signal output terminal of the nth stage of scanning driving circuit included in the driving circuit is respectively electrically connected to the (n−1)th row of pixel driving circuits, the nth row of pixel driving circuits and the (n−2)th row of pixel driving circuit, so the nth stage of scanning driving circuit is configured to provide a compensation control signal to the (n−2)th stage of pixel driving circuit, provide a data writing-in control signal to the (n−1)th row of pixel driving circuit and provide a reset control signal to the nth row of pixel driving circuits through the nth stage driving signal output terminal;

n is a positive integer, n is greater than 2, and n is less than N+1.

In at least one embodiment of the present disclosure, the nth stage of scanning driving circuit of the driving circuit can respectively provide the compensation control signal, the data writing-in control signal and the reset control signal to adjacent three rows of pixel driving circuits through the nth stage of driving signal output terminal.

In at least one embodiment of the present disclosure, the first stage of driving signal output terminal of the first stage of scanning driving circuit included in the driving circuit is electrically connected to the first row of pixel driving circuits, and the first stage of scanning driving circuit is configured to providing a reset control signal to the first row of pixel driving circuit through the first stage of driving signal output terminal;

The (N+2)th stage of driving signal output terminal of the (N+2)th stage of scanning driving circuit included in the driving circuit is electrically connected to the Nth row of pixel driving circuits, and the (N+2)th stage of scanning driving circuit is used to provide the compensation control signal to the Nth row of pixel driving circuits through the (N+2)th stage of driving signal output terminal.

In a specific implementation, the first stage of scanning driving circuit included in the driving circuit provides a reset control signal to the first row of pixel driving circuits through the first stage of driving signal output terminal, and the last stage of scanning driving circuit included in the driving circuit (that is to say, the (N+2)th stage of scanning driving circuit included in the scanning driving circuit) provides the compensation control signal to the last row of pixel driving circuits (that is, the Nth row of pixel driving circuits) through the last stage of driving signal output terminal.

Optionally, the second stage of driving signal output terminal of the second stage of scanning driving circuit included in the driving circuit is respectively electrically connected to the first row of pixel driving circuit and the second row of pixel driving circuit, and the second stage of scanning driving circuit is configured to provide a data writing-in control signal to the first row of the pixel driving circuit, and provide a reset control signal to the second row of pixel driving circuit through the second stage of driving signal output terminal;

The (N+1)th stage of driving signal output terminal of the (N+1)th stage of scanning driving circuit included in the scanning circuit is electrically connected to the (N−1)th row of pixel driving circuit and the Nth row of pixel driving circuit respectively, and the (N+1)th stage of scanning driving circuit is used to provide the compensation control signals to the (N−1)th row of pixel driving circuit and provide a data writing-in control signal to the Nth row of pixel driving circuit through the (N+1)th stage of driving signal output terminal.

In at least one embodiment of the present disclosure, the nth stage of scanning driving circuit includes an nth stage of driving signal output terminal, the nth stage of driving signal output terminal outputs the nth stage of driving signal; the first stage of scanning driving circuit includes a first stage of driving signal output terminal, the first stage of driving signal output terminal outputs the first stage of driving signal; the second stage of scanning driving circuit includes a second stage of driving signal output terminal, the second stage of driving signal output terminal outputs the second stage of driving signal; the (N+1)th stage of scanning driving circuit includes an (N+1)th stage of driving signal output terminal, the (N+1)th stage of driving signal output terminal outputs the (N+1)th stage of driving signal, and the (N+2)th stage of scanning driving circuit includes an (N+2)th stage of driving signal output terminal, the (N+2)th stage of driving signal output terminal outputs the (N+2)th stage of driving signal.

In FIG. 1, the one labeled GU1 is the first stage of scanning driving circuit, the one labeled GU2 is the second stage of scanning driving circuit, the one labeled GU3 is the third stage of scanning driving circuit, and the one labeled GU4 is the fourth stage of scanning driving circuit, the one labeled GU5 is the fifth stage of scanning driving circuit, the one labeled GUN−1 is the (N−1)th stage of scanning driving circuit, the one labeled GUN is the Nth stage of scanning driving circuit, and the one labeled GUN+1 is the (N+1)th stage of scanning driving circuit, the one labeled GN+2 is the (N+2)th stage of scanning driving circuit;

The one labeled P0 is a dummy pixel driving circuit, the one labeled P1 is the first row of pixel driving circuit, the one labeled P2 is the second row of pixel driving circuit, the one labeled P3 is the third row of pixel driving circuit, and the one labeled P4 is the fourth row of the pixel driving circuit, and the one labeled P5 is the fifth row of pixel driving circuit; the one labeled PN−1 is the (N−1)th row of pixel driving circuit; the one labeled PN is the Nth row of pixel driving circuit, and the one labeled PN−2 is the (N−2)th row of pixel driving circuit, and the one labeled PN−3 is the (N−3)th row of pixel driving circuit.

In at least one embodiment of the driving circuit shown in FIG. 1, the dummy pixel driving circuit P0 is not used to drive the corresponding light emitting elements to emit light, but to make the process conditions of each row of pixel driving circuit in the display area consistent, In at least one embodiment of the driving circuit shown in FIG. 1, the dummy pixel driving circuit P0 may not be provided.

When at least one embodiment of the driving circuit shown in FIG. 1 is in operation, GU1 provides a reset control signal to P1 through the first stage of driving signal output terminal O1;

GU2 provides a data writing-in control signal to P1 through the second stage of driving signal output terminal O2, and provides a reset control signal to P2;

GU3 provides a compensation control signal to P1 through the third stage of driving signal output terminal O3, provides a data writing-in control signal to P2, and provides a reset control signal to P3;

GU4 provides a compensation control signal to P2 through the fourth stage of driving signal output terminal O4, provides a data writing-in control signal to P3, and provides a reset control signal to P4;

GU5 provides a compensation control signal to P3 through the fifth stage of driving signal output terminal O5, provides a data writing-in control signal to P4, and provides a reset control signal to P5;

GUN−1 provides a compensation control signal to PN−3 through the (N−1)th stage of driving signal output terminal ON−1, provides a data writing-in control signal to PN−2, and provides a reset control signal to PN−1;

GUN provides a compensation control signal to PN−2 through the Nth stage of driving signal output terminal ON, provides a data writing-in control signal to PN−1, and provides a reset control signal to PN;

GUN+1 provides a compensation control signal to PN−1 through the (N+1)th stage of driving signal output terminal ON+1, and provides a data writing-in control signal to PN;

GUN+2 provides a compensation control signal to PN through the (N+2)th stage of driving signal output terminal ON+2.

In at least one embodiment of the driving circuit shown in FIG. 1, the first stage of scanning driving circuit GU1 provides a reset control signal to the first row of pixel driving circuit P1 through the first stage of driving signal output terminal O1, and the (N+2)th stage of scanning driving circuit GUN+2 provides a compensation control signal to the Nth row of pixel driving circuit PN through the (N+2)th stage of driving signal output terminal ON+2; the second stage of scanning driving circuit GU2 provides a data writing-in control signal to the first row of pixel driving circuit P1, and provides a reset control signal to the second row of pixel driving circuit P2 through the second stage of driving signal output terminal O2; the (N+1)th stage of scanning driving circuit GUN+1 provides a data writing-in control signal to the Nth row of pixel driving circuit PN, and provides a compensation control signal to the (N−1)th row of pixel driving circuit PN−1 through the (N+1)th stage of driving signal output terminal ON+1.

In at least one embodiment of the present disclosure, the driving circuit may further include a plurality of stages of light emitting control signal generation circuits;

The plurality of stages of light emitting control signal generation circuits are used to generate a plurality of stages of light emitting control signals, and provide the light emitting control signals to the rows of the pixel driving circuits respectively.

Figure 2:
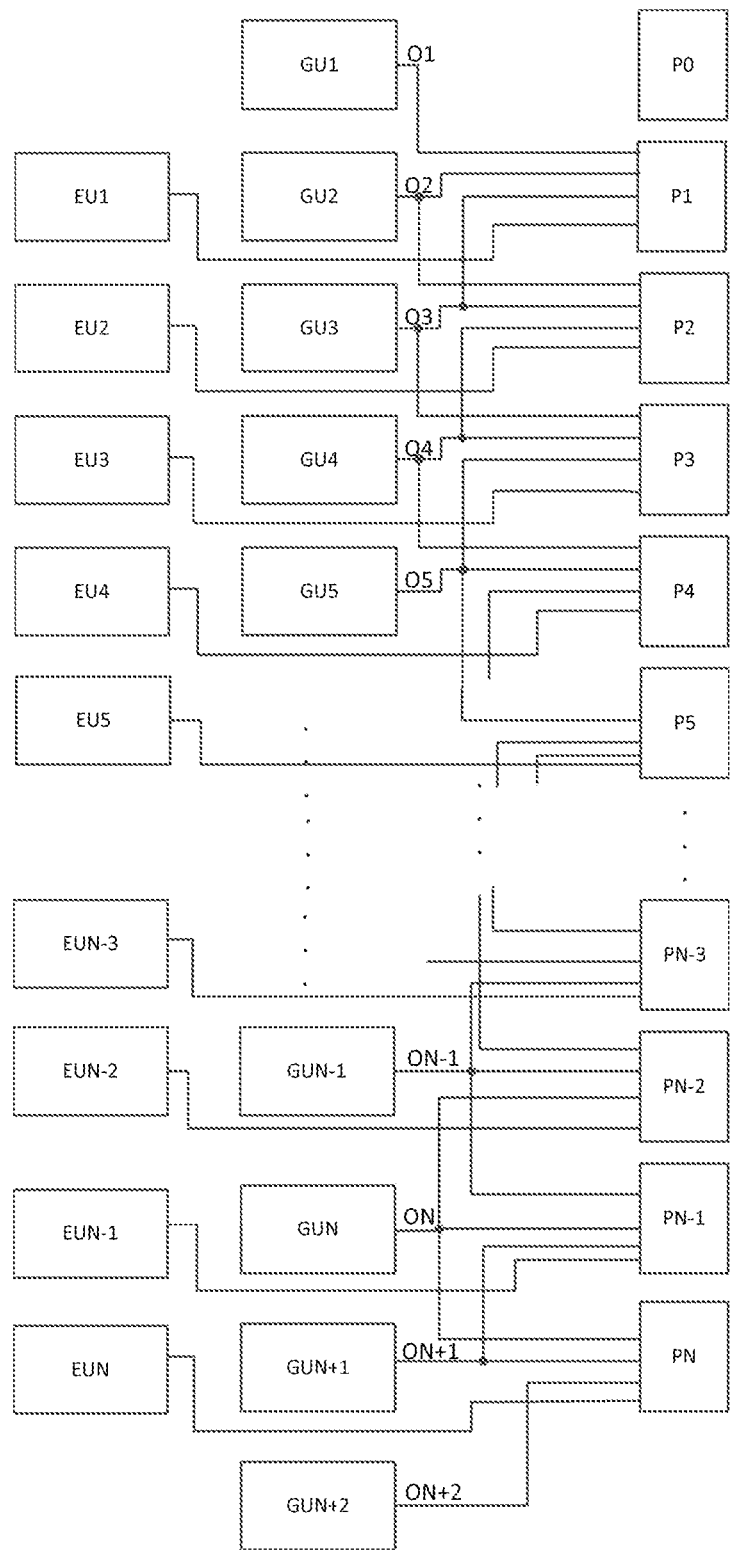
FIG. 2 is a structural diagram of a driving circuit according to at least one embodiment of the present disclosure.

As shown in FIG. 2, on the basis of at least one embodiment of the driving circuit shown in FIG. 1, the driving circuit further includes a plurality of stages of light emitting control signal generation circuits;

In FIG. 2, the one labeled EU1 is the first stage of light emitting control signal generation circuit included in the driving circuit, the one labeled EU2 is the second stage of light emitting control signal generation circuit included in the driving circuit, and the one labeled EU3 is the third stage of light emitting control signal generation circuit included in the driving circuit, the one labeled EU4 is the fourth stage of light emitting control signal generation circuit included in the driving circuit, and the one labeled EU5 is the fifth stage of light emitting control signal generation circuit included in the driving circuit, the one labeled EUN−3 is the (N−3)th stage of light emitting control signal generation circuit included in the driving circuit, and the one labeled EUN−2 is the (N−2)th stage of light emitting control signal generation circuit included in the driving circuit, the one labeled EUN−1 is the (N−1)th stage of light emitting control signal generation circuit included in the driving circuit, and the one labeled EUN is the Nth stage of light emitting control signal generation circuit included in the driving circuit;

EU1 provides the first stage of light emitting control signal for P1, EU2 provides the second stage of light emitting control signal for P2, EU3 provides the third stage of light emitting control signal for P3, EU4 provides the fourth stage of light emitting control signal for P4, and EU5 provides the fifth stage of light emitting control signal for P5; EUN−3 provides (N−3)th stage of light emitting control signal for PN−3, EUN−2 provides (N−2)th stage of light emitting control signal for PN−2, EUN−1 provides (N−1)th stage of light emitting control signal for PN−1, EUN provides Nth stage of light emitting control signal for PN.

Figure 3:
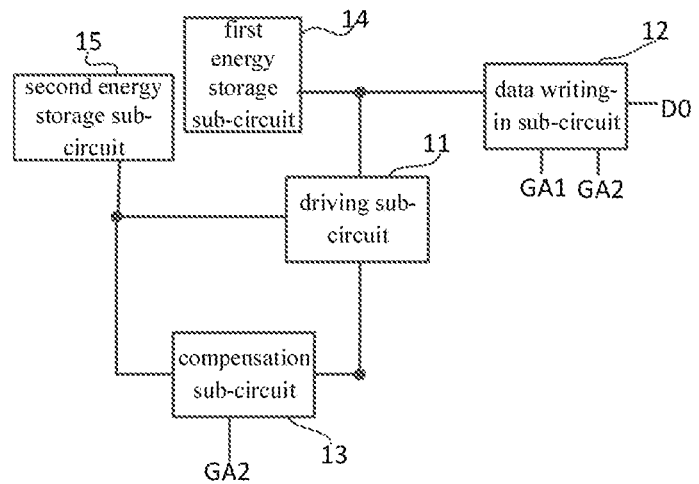
FIG. 3 is a structural diagram of a pixel driving circuit according to an embodiment of the present disclosure.

As shown in FIG. 3, at least one embodiment of the pixel driving circuit may include a driving sub-circuit 11, a data writing-in sub-circuit 12, a compensation sub-circuit 13, a first energy storage sub-circuit 14 and a second energy storage sub-circuit 15;

The data writing-in sub-circuit 12 is electrically connected to the data writing-in control line GA1, the compensation control line GA2, the data line DS, and the first end of the driving sub-circuit 11, respectively, is configured to write the data voltage Vdata provided by the data line DS into the first end of the driving sub-circuit 11 under the control of the data writing-in control line GA1 provided by the data writing-in control line and the compensation control signal provided by the compensation control line GA2;

The compensation sub-circuit 13 is electrically connected to the compensation control line GA2, the control end of the driving sub-circuit 11, and the second end of the driving sub-circuit 11, to control to connect the control end of the driving sub-circuit 11 and the second end of the driving sub-circuit 11 under the control of the compensation control signal;

The first energy storage sub-circuit 14 is electrically connected to the first end of the driving sub-circuit 11 for storing electric energy;

The second energy storage sub-circuit 15 is electrically connected to the control end of the driving sub-circuit 11 for storing electric energy.

When the pixel driving circuit shown in FIG. 3 is in operation, the display cycle includes a writing-in phase and a compensation phase set successively;

In the writing-in phase, the data writing-in sub-circuit 12 writes the data voltage Vdata provided by the data line DS into the first end of the driving sub-circuit 11 under the control of the data writing-in control signal and the compensation control signal, so as to charge the first energy storage sub-circuit 14; the compensation sub-circuit 13 controls to connect the control end of the driving sub-circuit 11 and the first end of the driving sub-circuit 11 under the control of the compensation control signal; the first energy storage sub-circuit 14 maintains the data voltage;

At the beginning of the writing-in phase, the driving sub-circuit 11 controls to connect the first end of the driving sub-circuit 11 and the second end of the driving sub-circuit 11 under the control of the potential of the control end of the driving sub-circuit 11, so as to charge the second energy storage sub-circuit 15 through the data voltage Vdata;

In the compensation phase, the data writing-in sub-circuit 12 controls to disconnect the data line DS from the first end of the driving sub-circuit 11 under the control of the data writing-in control signal, and the compensation sub-circuit 13 controls to connect the control end of the driving sub-circuit 11 and the first end of the driving sub-circuit 11 under the control of the compensation control signal.

When the pixel driving circuit shown in FIG. 3 is in operation, in the writing-in phase, the data writing-in sub-circuit 12 controls to write the data voltage Vdata into the first end of the driving sub-circuit 11, and stores the data voltage Vdata in the first energy storage sub-circuit 14, and the compensation sub-circuit 13 controls to connect the control end of the driving sub-circuit 11 and the first end of the driving sub-circuit 11; at the beginning of the writing-in phase, the driving sub-circuit 11 controls to connect the first end of the driving sub-circuit 11 and the second end of the driving sub-circuit 11 under the control of the potential of the control terminal of the driving sub-circuit, so as to charge the second energy storage sub-circuit 15 through the data voltage Vdata, to change the potential of the control end of the driving sub-circuit 11; even when the writing-in phase ends, the potential of the control end of the driving sub-circuit 11 cannot reach Vdata+Vth (Vth is the threshold voltage of the driving transistor in the driving sub-circuit 11), in the compensation phase, the second energy storage sub-circuit 15 can still be charged by the data voltage Vdata stored by the first energy storage sub-circuit 14, so that in the case of high-frequency frames, the time for charging the second energy storage sub-circuit 15 through the data voltage Vdata can be increased, the threshold voltage of the driving transistor included in the driving sub-circuit 11 is fully compensated to improve display uniformity, so that even when displaying a low-gray-scale image, the problem of image quality of uneven display can be improved.

In at least one embodiment of the present disclosure, the pixel driving circuit may further include a reset sub-circuit;

The reset sub-circuit is electrically connected to the data writing-in control line, the reset control line, the first initial voltage line and the control end of the driving sub-circuit respectively, and is used to write the first initial voltage provided by the first initial voltage line into the control end of the driving sub-circuit under the control of the data writing-in control signal and the reset control signal provided by the reset control line.

Figure 4:
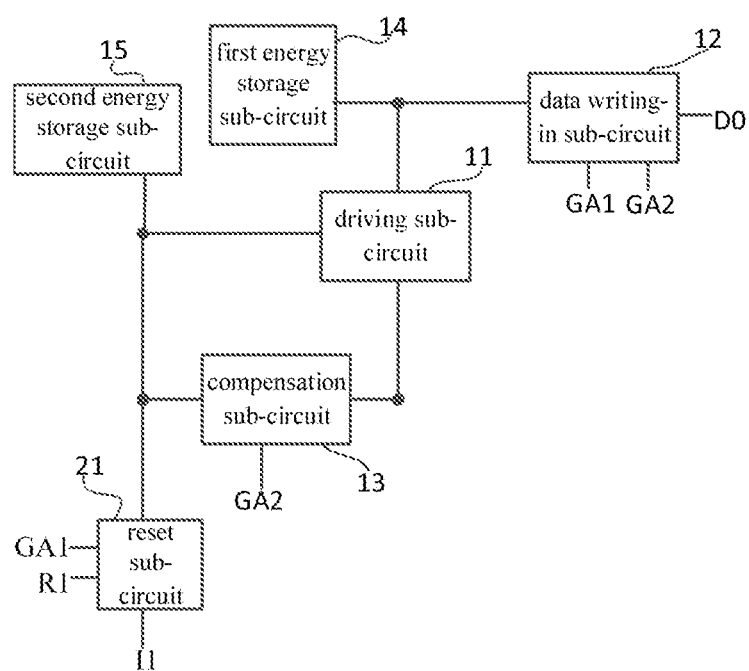
FIG. 4 is a structural diagram of a pixel driving circuit according to at least one embodiment of the present disclosure.

As shown in FIG. 4, on the basis of the pixel driving circuit shown in FIG. 3, the pixel driving circuit may further include a reset sub-circuit 21;

The reset sub-circuit 21 is electrically connected to the data writing-in control line GA1, the reset control line R1, the first initial voltage line I1 and the control end of the driving sub-circuit 11, respectively, and is configured to write the first initial voltage provided by the first initial voltage line I1 into the control end of the driving sub-circuit 11 under the control of the data writing-in control signal and the reset control signal provided by the reset control line R1.

When the pixel driving circuit shown in FIG. 4 is in operation, the display period may include a reset phase set before the writing-in phase;

In the reset phase, the reset sub-circuit 21 writes the first initial voltage into the control end of the drive sub-circuit 11 under the control of the data writing-in control signal and the reset control signal, so that at the beginning of the writing-in phase, the driving sub-circuit 11 can connect the first end and the second end of the driving sub-circuit 11.

In at least one embodiment of the present disclosure, the pixel driving circuit may further include a reset sub-circuit;

The reset sub-circuit is electrically connected to the reset control line, the first initial voltage line and the control end of the driving sub-circuit respectively, and is configured to write the first initial voltage provided by the first initial voltage line into the control end of the driving sub-circuit under the control of the reset control signal provided by the reset control line.

Figure 5:
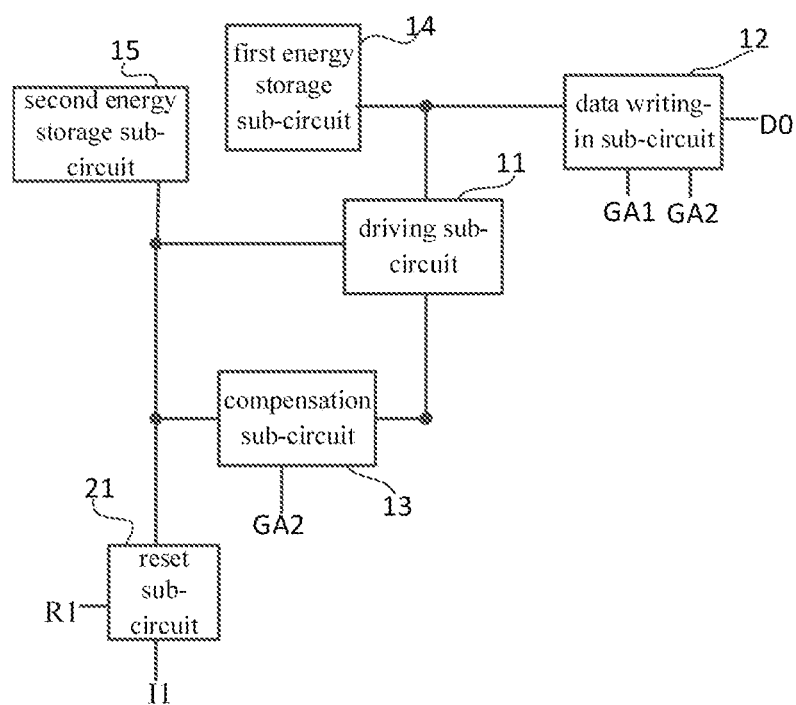
FIG. 5 is a structural diagram of a pixel driving circuit according to at least one embodiment of the present disclosure.

As shown in FIG. 5, on the basis of the pixel driving circuit shown in FIG. 3, the pixel driving circuit may further include a reset sub-circuit 21;

The reset sub-circuit 21 is electrically connected to the reset control line R1, the first initial voltage line I1 and the control end of the driving sub-circuit 11 respectively, and is configured to write the first initial voltage provided by the first initial voltage line I1 into the control end of the driving sub-circuit 11 under the control of the reset control signal provided by the reset control line R1.

When the pixel driving circuit shown in FIG. 5 of the present disclosure is in operation, the display period may include a reset phase set before the writing-in phase;

In the reset phase, the reset sub-circuit 21 writes the first initial voltage into the control end of the driving sub-circuit 11 under the control of the reset control signal, so that at the beginning of the writing-in phase, the driving sub-circuit 11 can connect the first end and the second end of the driving sub-circuit 11.

In at least one embodiment of the present disclosure, the pixel driving circuit may further include a light emitting element, a first light emitting control sub-circuit, a second light emitting control sub-circuit, and an initialization sub-circuit;

The first light emitting control sub-circuit is electrically connected to the light emitting control line, the power supply voltage line and the first end of the driving sub-circuit respectively, and is used to control to connect the power supply voltage line and the first end of the driving sub-circuit under the control of the light emitting control signal provided by the light emitting control line;

The second light emitting control sub-circuit is electrically connected to the light emitting control line, the second end of the driving sub-circuit and the first electrode of the light emitting element, and is used to control to connect the second end of the driving sub-circuit and the first electrode of the light emitting element, and connect the second electrode of the light emitting element and the first voltage terminal under the control of the light emitting control signal.

The initialization sub-circuit is respectively electrically connected to the data writing-in control line, the second initial voltage line and the first electrode of the light emitting element, and is used to write the second initial voltage provided by the second initial voltage line into the first electrode of the light emitting element under the control of the data writing-in control signal.

In specific implementation, the pixel driving circuit may also include a light emitting element, a first light emitting control sub-circuit, a second light emitting control sub-circuit and an initialization sub-circuit, the first light emitting control sub-circuit and the second light emitting control sub-circuit perform light emitting control, the initialization sub-circuit is used to write the second initial voltage into the first electrode of the light emitting element under the control of the data writing-in control signal, so that the light emitting element does not emit light, and clear the residual charge on the first electrode of the light emitting element.

Figure 6:
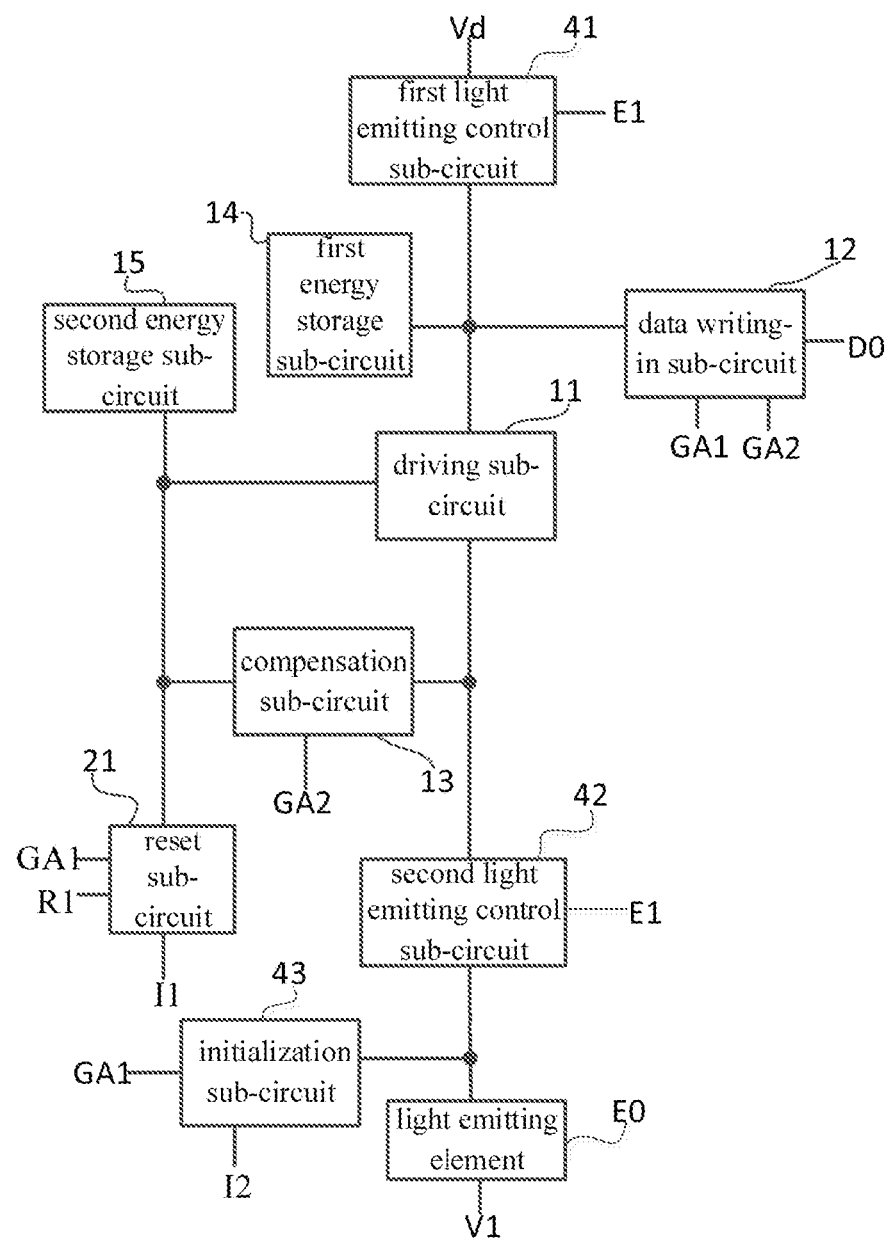
FIG. 6 is a structural diagram of a pixel driving circuit according to at least one embodiment of the present disclosure.

As shown in FIG. 6, on the basis of the pixel driving circuit shown in FIG. 4, the pixel driving circuit further includes a first light emitting control sub-circuit 41, a second light emitting control sub-circuit 42 and an initialization sub-circuit 43;

The first light emitting control sub-circuit 41 is electrically connected to the light emitting control line E1, the power supply voltage line Vd, and the first end of the driving sub-circuit 11, and is configured to control to connect the power supply voltage line Vd and the first end of the driving sub-circuit 11 under the control of the light emitting control signal provided by the light emitting control line E1;

The second light emitting control sub-circuit 42 is electrically connected to the light emitting control line E1, the second end of the driving sub-circuit 11 and the first electrode of the light emitting element E0 respectively, is configured to control to connect the second end of the driving sub-circuit 11 and the first electrode of the light emitting element E0; to connect the second electrode of the light emitting element E0 and the first voltage terminal V1 under the control of the light emitting control signal;

The initialization sub-circuit 43 is electrically connected to the data writing-in control line GA1, the second initial voltage line 12 and the first electrode of the light emitting element E0 respectively, and is used to write the second initial voltage provided by the second initial voltage line 12 into the first electrode of the light emitting element E0 under the control of the data writing-in control signal;

The second electrode of the light emitting element E0 is electrically connected to the first voltage terminal V1.

In at least one embodiment of the present disclosure, the first voltage terminal V1 may be a low voltage terminal or a ground terminal, but not limited thereto.

Figure 7:
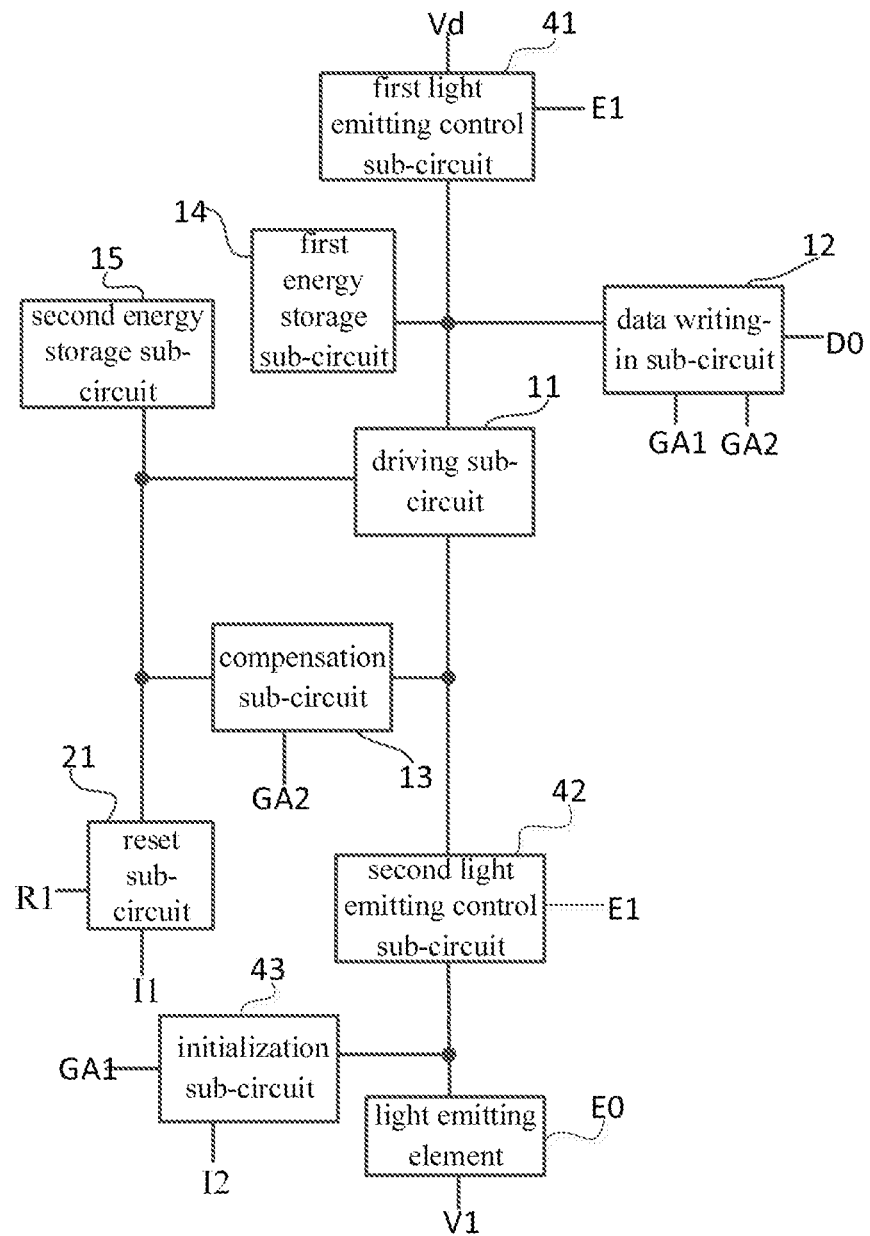
FIG. 7 is a structural diagram of a pixel driving circuit according to at least one embodiment of the present disclosure.

As shown in FIG. 7, on the basis of the pixel driving circuit shown in FIG. 5, the pixel driving circuit further includes a first light emitting control sub-circuit 41, a second light emitting control sub-circuit 42 and an initialization sub-circuit 43;

The first light emitting control sub-circuit 41 is electrically connected to the light emitting control line E1, the power supply voltage line Vd, and the first end of the driving sub-circuit 11, and is configured to control to connect the power supply voltage line Vd and the first end of the driving sub-circuit 11 under the control of the light emitting control signal provided by the light emitting control line E1;

The second light emitting control sub-circuit 42 is electrically connected to the light emitting control line E1, the second end of the driving sub-circuit 11 and the first electrode of the light emitting element E0 respectively, is configured to control to connect the second end of the driving sub-circuit 11 and the first electrode of the light emitting element E0; and connect the second electrode of the light emitting element E0 and the first voltage terminal V1 under the control of the light emitting control signal;

The initialization sub-circuit 43 is electrically connected to the data writing-in control line GA1, the second initial voltage line 12 and the first electrode of the light emitting element E0 respectively, and is used to write the second initial voltage provided by the second initial voltage line 12 into the first electrode of the light emitting element E0 under the control of the data writing-in control signal;

The second electrode of the light emitting element E0 is electrically connected to the first voltage terminal V1.

In at least one embodiment of the present disclosure, the first voltage terminal V1 may be a low voltage terminal or a ground terminal, but not limited thereto.

Optionally, the data writing-in sub-circuit includes a first transistor and a second transistor; the compensation sub-circuit includes a third transistor;

A control electrode of the first transistor is electrically connected to the data writing-in control line, a first electrode of the first transistor is electrically connected to the data line, and a second electrode of the first transistor is electrically connected to the first electrode of the second transistor;

A control electrode of the second transistor is electrically connected to the compensation control line, and a second electrode of the second transistor is electrically connected to the first end of the driving sub-circuit;

A control electrode of the third transistor is electrically connected to the compensation control line, a first electrode of the third transistor is electrically connected to the control end of the driving sub-circuit, and a second electrode of the third transistor is electrically connected to the second end of the driving sub-circuit.

Optionally, the first energy storage sub-circuit includes a first capacitor;

A first electrode plate of the first capacitor is electrically connected to the control end of the driving sub-circuit, and a second electrode plate of the first capacitor is electrically connected to the power supply voltage line.

Optionally, the reset sub-circuit includes a fourth transistor and a fifth transistor;

A control electrode of the fourth transistor is electrically connected to the reset control line, a first electrode of the fourth transistor is electrically connected to the first initial voltage line, and a second electrode of the fourth transistor is electrically connected to a first electrode of the fifth transistor;

A control electrode of the fifth transistor is electrically connected to the data writing-in control line, and a second electrode of the fifth transistor is electrically connected to the control end of the driving sub-circuit.

Optionally, the reset sub-circuit includes a fourth transistor;

A control electrode of the fourth transistor is electrically connected to the reset control line, a first electrode of the fourth transistor is electrically connected to the first initial voltage line, and a second electrode of the fourth transistor is electrically connected to the control end of the driving sub-circuit.

Optionally, the first light emitting control sub-circuit includes a sixth transistor, the second light emitting control sub-circuit includes a seventh transistor, the initialization sub-circuit includes an eighth transistor, and the driving sub-circuit includes a driving transistor. The second energy storage sub-circuit includes a second capacitor;

A control electrode of the sixth transistor is electrically connected to the light emitting control line, a first electrode of the sixth transistor is electrically connected to the power supply voltage line, and a second electrode of the sixth transistor is electrically connected to the first electrode of the driving transistor.

A control electrode of the seventh transistor is electrically connected to the light emitting control line, a first electrode of the seventh transistor is electrically connected to the second electrode of the driving transistor, and a second electrode of the seventh transistor is electrically connected to the first electrode of the light emitting element;

A control electrode of the eighth transistor is electrically connected to the data writing-in control line, a first electrode of the eighth transistor is electrically connected to the second initial voltage line, and a second electrode of the eighth transistor is electrically connected to the first electrode of the light emitting element;

A first electrode plate of the second capacitor is electrically connected to the control electrode of the driving transistor, and a second electrode plate of the second capacitor is electrically connected to the power supply voltage line.

Figure 8:
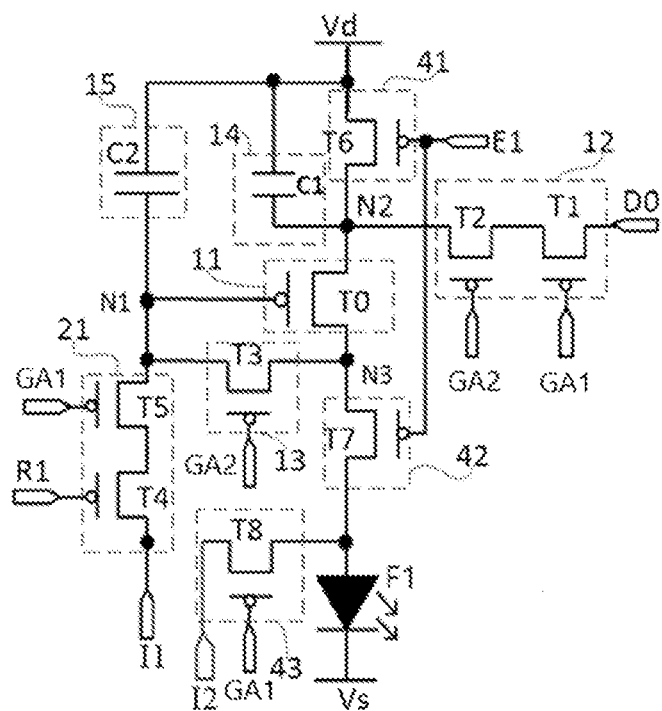
FIG. 8 is a circuit diagram of a pixel driving circuit according to at least one embodiment of the present disclosure.

As shown in FIG. 8, on the basis of the pixel driving circuit shown in FIG. 6, the data writing-in sub-circuit 12 includes a first transistor T1 and a second transistor T2; the compensation sub-circuit 13 includes a third transistor T3; the driving sub-circuit 11 includes a driving transistor T0; the light emitting element is an organic light emitting diode F1;

The gate electrode of the first transistor T1 is electrically connected to the data writing-in control line GA1, the source electrode of the first transistor T1 is electrically connected to the data line DS, and the drain electrode of the first transistor T1 is electrically connected to the source electrode of the second transistor T2;

The gate electrode of the second transistor T2 is electrically connected to the compensation control line GA2, and the drain electrode of the second transistor T2 is electrically connected to the source electrode of the driving transistor T0;

The gate electrode of the third transistor T3 is electrically connected to the compensation control line GA2, the source electrode of the third transistor T3 is electrically connected to the gate electrode of the driving transistor T0, and the drain electrode of the third transistor T3 is electrically connected to the drain electrode of the driving transistor T0;

The first energy storage sub-circuit 14 includes a first capacitor C1;

The first electrode plate of the first capacitor C1 is electrically connected to the source electrode of the driving transistor T0, and the second electrode plate of the first capacitor C1 is electrically connected to the power supply voltage line Vd;

The reset sub-circuit 21 includes a fourth transistor T4 and a fifth transistor T5;

The gate electrode of the fourth transistor T4 is electrically connected to the reset control line R1, the source electrode of the fourth transistor T4 is electrically connected to the first initial voltage line I1, and the drain electrode of the fourth transistor T4 is electrically connected to the source electrode of the fifth transistor T5;

The gate electrode of the fifth transistor T5 is electrically connected to the data writing-in control line GA1, and the drain electrode of the fifth transistor T5 is electrically connected to the gate electrode of the driving transistor T0;

The first light emitting control sub-circuit 41 includes a sixth transistor T6, the second light emitting control sub-circuit 42 includes a seventh transistor T7, the initialization sub-circuit 43 includes an eighth transistor T8, and the second energy storage sub-circuit 15 includes a second capacitor C2;

The gate electrode of the sixth transistor T6 is electrically connected to the light emitting control line E1, the source electrode of the sixth transistor T6 is electrically connected to the power supply voltage line Vd, and the drain electrode of the sixth transistor T6 is electrically connected to the source electrode of the driving transistor T0;

The gate electrode of the seventh transistor T7 is electrically connected to the light emitting control line E1, the source electrode of the seventh transistor T7 is electrically connected to the drain electrode of the driving transistor T0, and the drain electrode of the seventh transistor T7 is electrically connected to the anode of the organic light emitting diode F1; the cathode of the organic light emitting diode F1 is electrically connected to the low voltage terminal Vs;

The gate electrode of the eighth transistor T8 is electrically connected to the data writing-in control line GA1, the source electrode of the eighth transistor T8 is electrically connected to the second initial voltage line I2, and the drain electrode of the eighth transistor T8 is electrically connected to the anode of the organic light emitting diode F1;

A first electrode plate of the second capacitor C2 is electrically connected to the gate electrode of the driving transistor T0, and a second electrode plate of the second capacitor C2 is electrically connected to the power supply voltage line Vd.

In at least one embodiment of the pixel driving circuit shown in FIG. 8, all transistors are p-type transistors, but not limited thereto.

In at least one embodiment of the pixel driving circuit shown in FIG. 8, the first initial voltage line and the second initial voltage line may be the same initial voltage line, and the initial voltage line is used to provide an initial voltage, but not limited thereto.

In at least one embodiment of the pixel driving circuit shown in FIG. 8, T3 may be a double-gate transistor to reduce leakage, but not limited thereto.

In at least one embodiment of the pixel driving circuit shown in FIG. 8, the first node N1 is electrically connected to the gate electrode of the driving transistor T0, the second node N2 is electrically connected to the source electrode of the driving transistor T0, and the third node N3 is electrically connected to the drain electrode of driving transistor T0.

Figure 9:
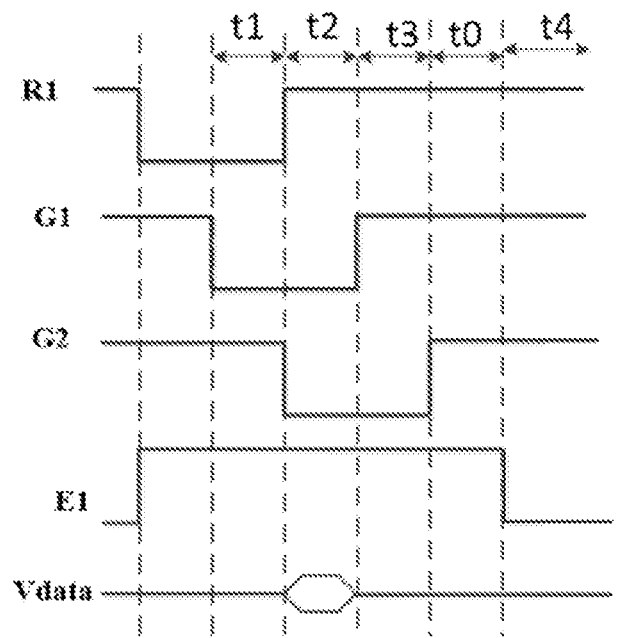
FIG. 9 is a working timing diagram of the pixel driving circuit shown in FIG. 6 according to the at least one embodiment of present disclosure.

As shown in FIG. 9, when the pixel driving circuit shown in FIG. 8 of the present disclosure is in operation, the display period may include a reset phase t1, a writing-in phase t2, a compensation phase t3, and a light emitting phase t4 set successively; a buffering phase t0 is provided between the compensation phase t3 and the light emitting phase t4;

In the reset phase t1, R1 provides a low voltage signal, GA1 provides a low voltage signal, GA2 provides a high voltage signal, E1 provides a high voltage signal, T6, T7, T3 and T2 are turned off, T4 is turned on, and T8 is turned on, so that the initial voltage is written into the gate electrode of T0 and the anode of F1, when the writing-in phase t2 starts, T0 can be turned on, and make F1 not emit light, and clear the residual charge of the anode of F1;

In the writing-in phase t2, R1 provides a high voltage signal, GA1 provides a low voltage signal, GA2 provides a low voltage signal, E1 provides a high voltage signal, T6 and T7 are turned off, T3, T1, T8, T2 and T5 are turned on, and DS provides the data voltage Vdata to write the data voltage Vdata into the source electrode of T0 to charge C1, and C1 stores the data voltage Vdata; T3 is turned on;

At the beginning of the writing-in phase t2, T0 is turned on, so as to charge C2 through the data voltage Vdata, and increase the potential of the first node N1;

In the writing-in phase t2, as the potential of the first node N1 increases, the current flowing through T0 becomes smaller and smaller, and the potential of the first node N1 increases more and more slowly. If the writing-in phase t2 lasts long enough, the potential of the first node N1 will eventually reach Vdata+Vth, and Vth is the threshold voltage of T0; however, because the display products with high-frequency frames (such as 120 Hz) have a short turn-on time for each row of gate lines, the potential of the first node N1 has not reached Vdata+Vth, the data writing-in control signal provided by GA1 becomes a high voltage signal, T1 is cut off, and Vdata finishes writing the signal into the pixel through T1;

In the writing-in phase t2, T8 is turned on, and the initial voltage is written into the anode of F1 to eliminate the charge on the interface of the light emitting layer;

When the writing-in phase t2 ends, the potential of the second node N2 reaches the same potential as Vdata, while T0 is still in an on state to a certain extent;

In the compensation phase t3, R1 provides a high voltage signal, GA1 provides a high voltage signal, GA2 provides a low voltage signal, E1 provides a high voltage signal, T6, T7, T4, T1, T8 and T5 are cut off, T2 is turned on, T3 is turned on, and C1 has stored Vdata in the writing-in phase t2. In the compensation phase, since T0 is not turned off, C1 will continue to charge C2 through T0 and T3, and the potential of the first node N1 will continue to rise until T0 is cut off. In the compensation phase t3, since the potential of the first node N1 is increased a small, and the charge consumption is limited. C1 can be approximated as a constant voltage source, so the potential of the first node N1 finally reaches Vdata+Vth until GA2 provides a high voltage signal, and the compensation phase t3 ends;

In the buffer phase t0, E1 provides a high voltage signal, R1, GA1 and GA2 all provide high voltage signals, T4, T3, T1, T8, T2 and T5 are all cut off, and in the buffer phase t0, the potential of the first node N1 remains unchanged, the duration of the buffering phase to is determined by the turning-on time point of E1;

In the light emitting phase t4, E1 provides a low voltage signal, R1, GA1, and GA2 all provide high-voltage signals, T4, T3, T1, T8, T2, and T5 are all turned off, T6 and T7 are turned on, and F1 emits light; the gate-source voltage of T0 Vgs=Vdata+Vth−Vdz, where Vdz is the voltage value of the power supply voltage signal provided by Vd; the driving current If1 for T0 to drive F1 to emit light is equal to $K(Vdz-Vdata)^2$, where K is the current coefficient of T0; K is a constant related to process and design of T0.

At least one embodiment of the pixel driving circuit shown in FIG. 8 of the present disclosure is in operation, C2 is charged through the data voltage Vdata during the writing-in phase t2 and the compensation phase t3 until T0 is turned off, so as to increase the time for charging C2 through the data voltage Vdata, the threshold voltage of the driving transistor T0 is fully compensated, the display uniformity is improved.

As shown in FIG. 9, in the writing-in phase t2, both the data writing-in control signal provided by GA1 and the compensation control signal provided by GA2 are low voltage signals.

Figure 10:
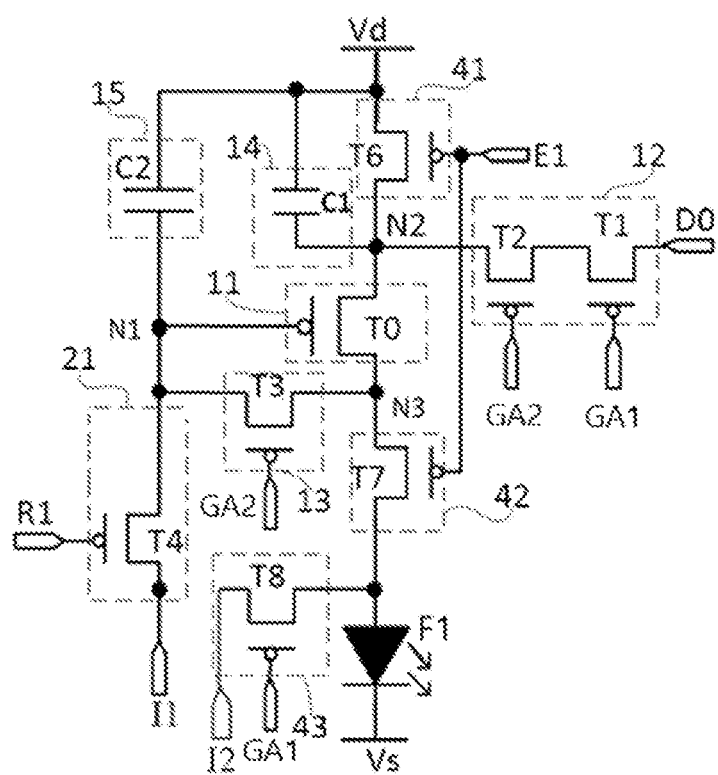
FIG. 10 is a circuit diagram of a pixel driving circuit according to at least one embodiment of the present disclosure.

As shown in FIG. 10, on the basis of at least one embodiment of the pixel driving circuit shown in FIG. 7, the data writing-in sub-circuit 12 includes a first transistor T1 and a second transistor T2; the compensation sub-circuit 13 includes a third transistor T3; the driving sub-circuit 11 includes a driving transistor T0; the light emitting element is an organic light emitting diode F1;

The gate electrode of the first transistor T1 is electrically connected to the data writing-in control line GA1, the source electrode of the first transistor T1 is electrically connected to the data line DS, and the drain electrode of the first transistor T1 is electrically connected to the source electrode of the second transistor T2;

The gate electrode of the second transistor T2 is electrically connected to the compensation control line GA2, and the drain electrode of the second transistor T2 is electrically connected to the source electrode of the driving transistor T0;

The gate electrode of the third transistor T3 is electrically connected to the compensation control line GA2, the source electrode of the third transistor T3 is electrically connected to the gate electrode of the driving transistor T0, and the drain electrode of the third transistor T3 is electrically connected to the drain electrode of the driving transistor T0;

The first energy storage sub-circuit 14 includes a first capacitor C1;

The first electrode plate of the first capacitor C1 is electrically connected to the source electrode of the driving transistor T0, and the second electrode plate of the first capacitor C1 is electrically connected to the power supply voltage line Vd;

The reset sub-circuit 21 includes a fourth transistor T4;

The gate electrode of the fourth transistor T4 is electrically connected to the reset control line R1, the source electrode of the fourth transistor T4 is electrically connected to the first initial voltage line I1, and the drain electrode of the fourth transistor T4 is electrically connected to the gate electrode of the driving transistor T0;

The first light emitting control sub-circuit 41 includes a sixth transistor T6, the second light emitting control sub-circuit 42 includes a seventh transistor T7, the initialization sub-circuit 43 includes an eighth transistor T8, and the second energy storage sub-circuit 15 includes a second capacitor C2;

The gate electrode of the sixth transistor T6 is electrically connected to the light emitting control line E1, the source electrode of the sixth transistor T6 is electrically connected to the power supply voltage line Vd, and the drain electrode of the sixth transistor T6 is electrically connected to the source electrode of the driving transistor T0;

The gate electrode of the seventh transistor T7 is electrically connected to the light emitting control line E1, the source electrode of the seventh transistor T7 is electrically connected to the drain electrode of the driving transistor T0, and the drain electrode of the seventh transistor T7 is electrically connected to the anode of the organic light emitting diode F1; the cathode of the organic light emitting diode F1 is electrically connected to the low voltage terminal Vs;

The gate electrode of the eighth transistor T8 is electrically connected to the data writing-in control line GA1, the source electrode of the eighth transistor T8 is electrically connected to the second initial voltage line 12, and the drain electrode of the eighth transistor T8 is electrically connected to the anode of the organic light emitting diode F1;

A first electrode plate of the second capacitor C2 is electrically connected to the gate electrode of the driving transistor T0, and a second electrode plate of the second capacitor C2 is electrically connected to the power supply voltage line Vd.

In at least one embodiment of the pixel driving circuit shown in FIG. 10, all transistors are p-type transistors, but not limited thereto.

In at least one embodiment of the pixel driving circuit shown in FIG. 10, the first initial voltage line and the second initial voltage line may be the same initial voltage line, and the initial voltage line is used to provide an initial voltage, but not limited thereto.

In at least one embodiment of the pixel driving circuit shown in FIG. 10, the first node N1 is electrically connected to the gate electrode of the driving transistor T0, the second node N2 is electrically connected to the source electrode of the driving transistor T0, and the third node N3 is electrically connected to the drain electrode of the driving transistor T0.

As shown in FIG. 9, when at least one embodiment of the pixel driving circuit shown in FIG. 10 of the present disclosure is in operation, the display period may include a reset phase t1, a writing-in phase t2, a compensation phase t3, and a light emitting phase t4 set successively; a buffering phase t0 is provided between the compensation phase t3 and the light emitting phase t4;

In the reset phase t1, R1 provides a low voltage signal, GA1 provides a low voltage signal, GA2 provides a high voltage signal, E1 provides a high voltage signal, T6, T7, T3 and T2 are turned off, T4 is turned on, and T8 is turned on, so that the initial voltage is written into the gate electrode of T0 and the anode of F1, so that when the writing-in phase t2 starts, T0 can be turned on, and make F1 not emit light, and clear the residual charge of the anode of F1;

In the writing-in phase t2, R1 provides a high voltage signal, GA1 provides a low voltage signal, GA2 provides a low voltage signal, E1 provides a high voltage signal, T6 and T7 are turned off, T3, T1, T8 and T2 are turned on, and DS provides the data voltage Vdata, to write the data voltage Vdata into the source electrode of T0 to charge C1, and C1 stores the data voltage Vdata; T3 is turned on;

At the beginning of the writing-in phase t2, T0 is turned on, so as to charge C2 through the data voltage Vdata, and increase the potential of the first node N1;

In the writing-in phase t2, as the potential of the first node N1 increases, the current flowing through T0 becomes smaller and smaller, and the potential of the first node N1 rises more and more slowly. If the duration of the writing-in phase t2 lasts long enough, the potential of the first node N1 will eventually reach Vdata+Vth, and Vth is the threshold voltage of T0; however, because the display products of high-frequency frames (such as 120 Hz) have a short opening time for each row of gate lines, the potential of the first node N1 has not reached Vdata+Vth, the data writing-in control signal provided by GA1 becomes a high voltage signal, T1 is cut off, and Vdata finishes writing the signal into the pixel through T1;

In the writing-in phase t2, T8 is turned on, and the initial voltage is written into the anode of F1 to eliminate the charge on the interface of the light emitting layer;

When the writing-in phase t2 ends, the potential of the second node N2 reaches the same potential as Vdata, while T0 is still in an on state to a certain extent;

In the compensation phase t3, R1 provides a high voltage signal, GA1 provides a high voltage signal, GA2 provides a low voltage signal, E1 provides a high voltage signal, T6, T7, T4, T1 and T8 are cut off, T2 is turned on, T3 is turned on, and C1 stores Vdata in the writing-in phase t2. In the compensation phase, since T0 is not turned off, C1 will continue to charge C2 through T0 and T3, and the potential of the first node N1 will continue to rise until T0 is cut off. Because in the compensation phase t3, the potential of the first node N1 increases small, and the consumption charge is limited. C1 can be approximated as a constant voltage source, so the potential of the first node N1 finally reaches Vdata+Vth until GA2 provides a high voltage signal, and the compensation phase t3 ends;

In the buffer phase t0, E1 provides a high-voltage signal, R1, GA1, and GA2 all provide high-voltage signals, and T4, T3, T1, T8, and T2 are all cut off. In the buffer phase to, the potential of the first node N1 remains unchanged, so the duration of the buffer phase to is determined by the turning-on time point of E1;

In the light emitting phase t4, E1 provides a low-voltage signal, R1, GA1, and GA2 all provide a high-voltage signal, T4, T3, T1, T8, and T2 are all turned off, T6 and T7 are turned on, and F1 emits light; the gate-source voltage of T0 Vgs=Vdata+Vth−Vdz, where Vdz is the voltage value of the power supply voltage signal provided by Vd; the driving current If1 for T0 to drive F1 to emit light is equal to $K(Vdz-Vdata)_2$, where K is the current coefficient of T0; K is a constant related to the process and design of T0.

The pixel driving circuit shown in FIG. 10 of the present disclosure can charge C2 through the data voltage Vdata during the writing-in phase t2 and the compensation phase t3 until T0 is turned off, so as to increase the time for charging C2 through the data voltage Vdata, the threshold voltage of the driving transistor T0 is fully compensated, display uniformity is improved.

In at least one embodiment of the present disclosure, the driving circuit further includes N rows of reset control lines, N rows of data writing-in control lines, and N rows of compensation control lines; the reset control lines, the data writing-in control lines and the compensation control lines all extend along the first direction;

The pixel driving circuit included in the driving circuit is electrically connected to the corresponding row of reset control line, the corresponding row of data writing-in control line and the corresponding row of compensation control line;

Each row of reset control line, each row of the data writing-in control line, and each row of the compensation control line extend to the peripheral area along the first direction, and in the peripheral area, the nth row of reset control line in, the (n−1)th row of data writing-in control line and the (n−2)th row of compensation control line are electrically connected;

n is a positive integer, n is greater than 2, and n is less than N+1; N is an integer greater than 1.

Optionally, the first row of data writing-in control line is electrically connected to the second row of reset control line, and the Nth row of data writing-in control line is electrically connected to the (N−1)th row of the compensation control line.

In a specific implementation, each row of pixel driving circuit included in the driving circuit is electrically connected to the corresponding row of reset control line, the corresponding row of data writing-in control line and the corresponding row of compensation control line, and the pixel driving circuit can be arranged in the display area of the display substrate, each row of reset control line, each row of data writing-in control line and each row of compensation control line extend along the first direction and extend to the peripheral area. The nth row of the reset control line, the (n−1)th row of data writing-in control line and the (n−2)th row of compensation control line are electrically connected to each other to receive the nth stage of driving signal from the nth stage of scanning driving circuit included in the driving circuit; the first row of data writing-in control line is electrically connected to the second row of reset control line to receive the second stage of driving signal from the second stage of scanning driving circuit included in the driving circuit, and the Nth row of data writing-in control line is electrically connected to the (N−1)th row of compensation control line to receive (N+1)th stage of driving signal from the (N+1)th stage of scanning driving circuit included in the driving circuit.

Figure 11:
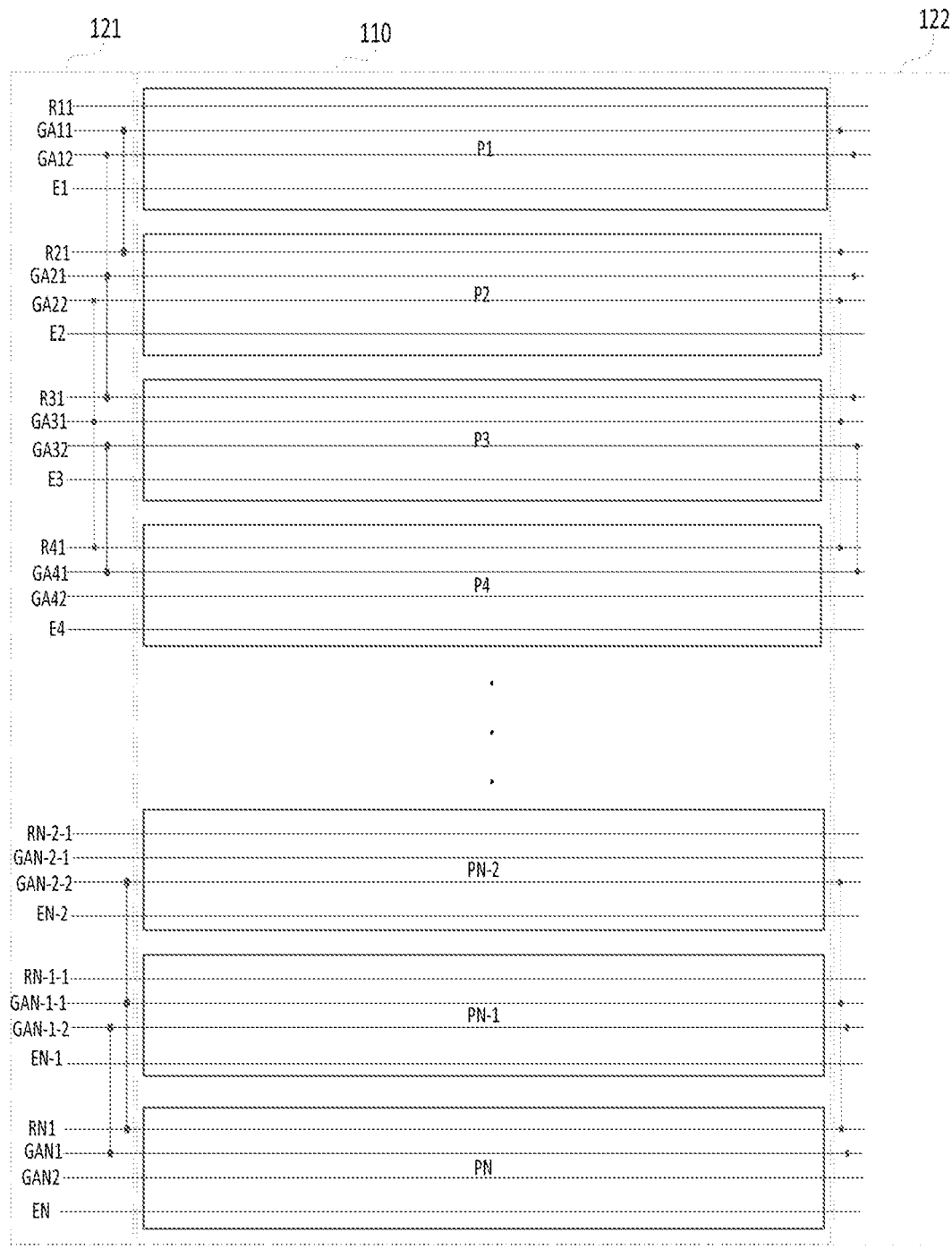
FIG. 11 is a schematic diagram of the connection relationship between a plurality of control lines electrically connected to each row of pixel driving circuits in the driving circuit according to at least one embodiment of the present disclosure.

As shown in FIG. 11, multiple rows and multiple columns of pixel driving circuits are arranged in the display area 110;

In FIG. 11, P1 is the first row of the pixel driving circuit, P2 is the second row of the pixel driving circuit, P3 is the third row of the pixel driving circuit, P4 is the fourth row of the pixel driving circuit, PN−1 is the (N−1)th row of the pixel driving circuit, PN is the Nth row of the pixel driving circuit, PN−2 is the (N−2)th row of the pixel driving circuit.

The first row of pixel driving circuit P1 is electrically connected to the first row of reset control line R11, the first row of data writing-in control line GA11, the first row of compensation control line GA12 and the first row of light emitting control line E1;

The second row of pixel driving circuit P2 is electrically connected to the second row of reset control line R21, the second row of data writing-in control line GA21, the second row of compensation control line GA22 and the second row of light emitting control line E2;

The third row of pixel driving circuit P3 is electrically connected to the third row of reset control line R31, the third row of data writing-in control line GA31, the third row of compensation control line GA32 and the third row of light emitting control line E3;

The (N−2)th row of pixel driving circuit PN−2 is electrically connected to the (N−2)th row of reset control line RN-2-1, the (N−2)th row of data writing-in control line GAN-2-1, the (N−2)th row of compensation control line GAN-2-2 and the (N−2)th row of light emitting control line EN−2;

The (N−1)th row of pixel driving circuit PN−1 is electrically connected to the (N−1)th row of reset control line RN-1-1, the (N−1)th row of data writing-in control line GAN-1-1, the (N−1)th row of compensation control line GAN-1-2 and the (N−1)th row of light emitting control line EN−1;

The Nth row of pixel driving circuit PN is electrically connected to the Nth row of reset control line RN1, the Nth row of data writing-in control line GAN1, the Nth row of compensation control line GAN2 and the Nth row of light emitting control line EN.

Each row of control lines extends horizontally and extends to the peripheral area; the peripheral area includes a first side area 121 and a second side area 122;

In at least one embodiment shown in FIG. 11, the first direction is the horizontal direction, the first side area 121 is the left side area, and the second side area 122 is the right side area, but not limited thereto.

As shown in FIG. 11, in the first side area 121 and the second side area 122, the first row of data writing-in control line GA11 is electrically connected to the second row of reset control line R21, the second row of data writing-in control line GA21, the third row of reset control line R31 and the first row of the compensation control line GA12; the third row of data writing-in control line GA31 and the fourth row of the reset control line R41 are electrically connected with the second row of the compensation control line GA22; the fourth row of data writing-in control line GA41, the third row of compensation control line GA32 are electrically connected to the fifth row of reset control line (not shown in FIG. 11); the (N−1)th row of data writing-in control line GAN-1-1, the Nth row of reset control line RN1 are electrically connected to the (N−2)th row of compensation control line GAN-2-2; the Nth row of data writing-in control line GAN1 is electrically connected to the (N−1)th row of compensation control line GAN-1-2.

In at least one embodiment of the present disclosure, the scanning driving circuit may be arranged in the first side area 121 and the second side area 122. In actual operation, the scanning driving circuit can also be arranged in the first side area 121 or the second side area 122, at this time, each row of control lines are connected to each other in the first side area 121 or the second side area 122.

Figure 12:
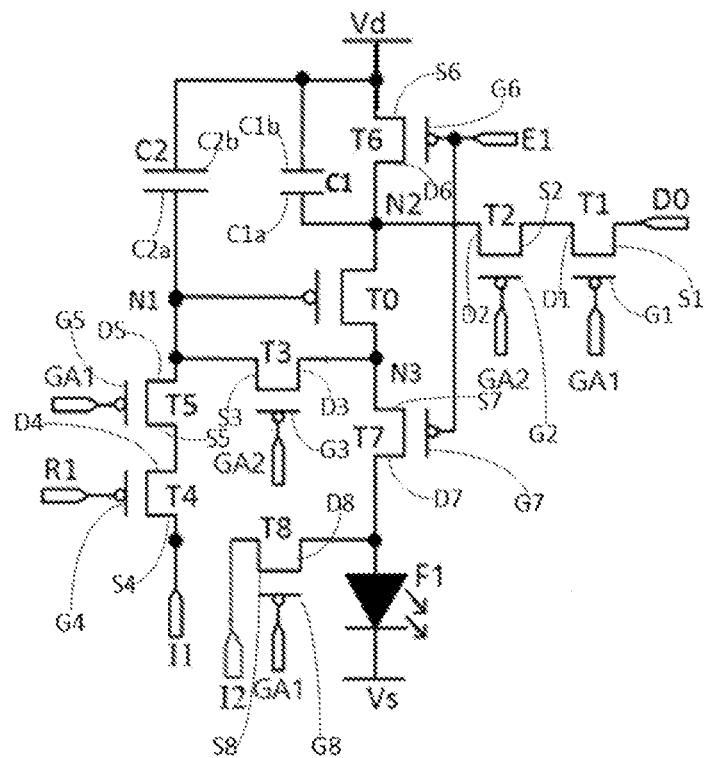
FIG. 12 is a schematic diagram showing the electrodes of transistors and electrode plates of the capacitors on the basis of the pixel driving circuit shown in FIG. 8.
Figure 14:
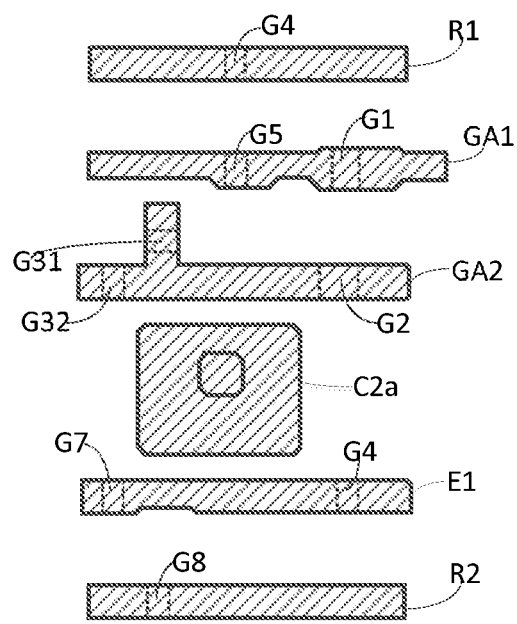
FIG. 14 is a layout diagram of the first gate metal layer in FIG. 18.
Figure 15:
FIG. 15 is a layout diagram of the second gate metal layer in FIG. 18.
Figure 15:
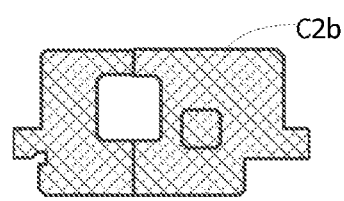
Figure 15:
Figure 16:
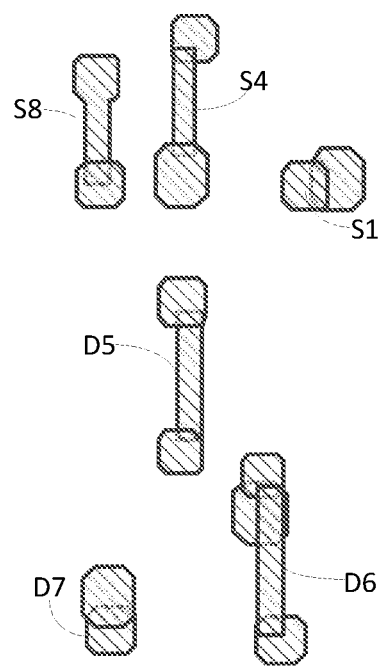
FIG. 16 is a layout diagram of the first source-drain metal layer in FIG. 18.

The driving circuit described in at least one embodiment of the present disclosure may further include N rows of light emitting control lines, and the pixel driving circuit included in the driving circuit is also electrically connected to the corresponding row of light emitting control line;

As shown in FIG. 12, each row of pixel driving circuits may respectively include a first transistor T1, a second transistor T2, a third transistor T3, a fourth transistor T4, a fifth transistor T5, a sixth transistor T6, a seventh transistor T7, an eighth transistor T8, a first capacitor C1 and a second capacitor C2;

As shown in FIG. 14, the gate electrode G4 of the fourth transistor T4 and the corresponding row of reset control line R1 form an integrated structure; the gate electrode G8 of the eighth transistor T8 and a row of reset control line R2 adjacent and next to the corresponding row of reset control line R1 form an integrated structure; the gate electrode G1 of the first transistor T1, the gate electrode G5 of the fifth transistor T5 and the corresponding row of data writing-in control line GA1 form an integrated structure; the first gate electrode G31 of the third transistor T3, the second gate electrode G32 of the third transistor T3, the gate electrode G2 of the second transistor T2 and the corresponding row of compensation control line GA2 form an integrated structure; the gate electrode G6 of the sixth transistor T6, the gate electrode G7 of the seventh transistor T7 and the corresponding row of light emitting control line E1 form an integrated structure; the gate electrode of the driving transistor T0 is arranged between the corresponding row of compensation control line GA2 and the corresponding row of light emitting control line E1; the gate electrode of the driving transistor T0 is multiplexed as the first electrode plate C2a of the second capacitor C2; as shown in FIG. 15, the second electrode plate C2b of the second capacitor C2 is multiplexed as the second electrode plate of the first capacitor C1; as shown in FIG. 16, the drain electrode D6 of the sixth transistor is multiplexed as the first electrode plate of the first capacitor C1;

As shown in FIG. 14, the corresponding row of reset control line R1, the corresponding row of data writing-in control line GA1, the corresponding row of compensation control line GA2 and the corresponding row of light emitting control line E1 electrically connected to the same row of pixel driving circuits are arranged in sequence along the second direction;

The first direction intersects the second direction.

During specific implementation, the next row of reset control line R2 adjacent to the corresponding row of reset control line R1 and the corresponding row of data writing-in control line GA1 may extend to the peripheral area, and in the peripheral area, the next row of reset control line R2 adjacent to the corresponding row of reset control line R1 is electrically connected to the corresponding row of data writing-in control line GA1.

In at least one embodiment shown in FIGS. 13-19, the first direction is a horizontal direction, and the second direction is a vertical direction, but not limited thereto.

Through the above layout, each row of control lines and the transistors included in the pixel driving circuit can be arranged reasonably, so that the layout is simple and the layout difficulty is low.

Optionally, the driving circuit described in at least one embodiment of the present disclosure may further include N rows of second initial voltage lines; the pixel driving circuit included in the driving circuit is also electrically connected to the corresponding row of second initial voltage line;

As shown in FIG. 15, the second initial voltage line 12 and the second electrode plate C2b of the second capacitor C2 are arranged at the same layer;

The orthographic projection of the corresponding row of the second initial voltage line 12 on the substrate is located on a side of the orthographic projection of the corresponding row of reset control line R1 on the substrate away from the orthographic projection of the corresponding row of the data writing-in control line GA1 on the substrate, so as to rationally arrange the second initial voltage line 12, so that the source electrode S8 of T8 is electrically connected to the second initial voltage line 12.

As shown in FIG. 12, on the basis of at least one embodiment of the pixel driving circuit shown in FIG. 8, the electrodes of transistors and the electrode plates of capacitors are marked.

In FIG. 12, the one labeled G1 is the gate electrode of T1, the one labeled S1 is the source electrode of T1, the one labeled D1 is the drain electrode of T1, the one labeled G2 is the gate electrode of T2, and the one labeled S2 is the source electrode of T2, the one labeled D2 is the drain electrode of T2, the one labeled G3 is the gate electrode of T3, the one labeled S3 is the source electrode of T3, the one labeled D3 is the drain electrode of T3, and the one labeled G4 is the gate electrode of T4, the one labeled S4 is the source electrode of T4, the one labeled D4 is the drain electrode of T4, the one labeled G5 is the gate electrode of T5, the one labeled S5 is the source electrode of T5, and the one labeled D5 is the drain electrode of T5, the one labeled G6 is the gate electrode of T6, the one labeled S6 is the source electrode of T6, the one labeled D6 is the drain electrode of T6, the one labeled G7 is the gate electrode of T7, and the one labeled S7 is the source electrode of T7, the one labeled D7 is the drain electrode of T7, the one labeled G8 is the gate electrode of T8, the one labeled S8 is the source electrode of T8, and the one labeled D8 is the drain electrode of T8;

The one labeled C1a is the first electrode plate of C1, the one labeled C1b is the second electrode plate of C1, the one labeled C2a is the first electrode plate of C2, and the one labeled C2b is the second electrode plate of C2.

Figure 13:
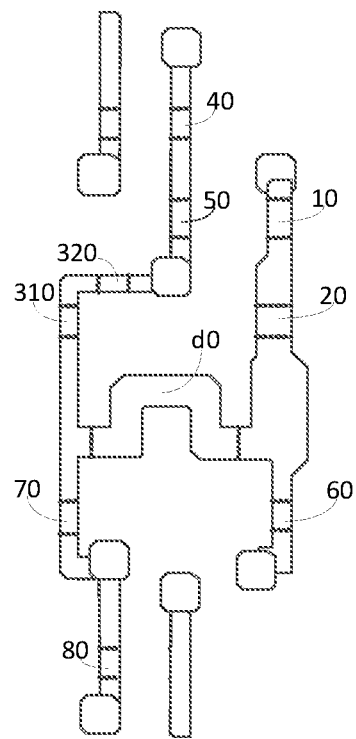
FIG. 13 is a layout diagram of the active layer in FIG. 18.

In FIG. 13, the one marked by 10 is the channel of the first transistor T1, the one marked by 20 is the channel of the second transistor T2, and the one marked by 310 is a first channel of the third transistor T3, the one marked by 320 is the second channel of the third transistor T3, the one marked by 40 is the channel of the fourth transistor T4, the one marked by 50 is the channel of the fifth transistor T5, the one marked by 60 is the channel of the sixth transistor T6, the one marked by 70 is the channel of the seventh transistor T7, the one marked by 80 is the channel of the eighth transistor T8, and the one marked by do is the channel of the driving transistor T0.

As shown in FIG. 13, the active layer of the fourth transistor T4, the active layer of the fifth transistor T5, the active layer of the third transistor T3, the active layer of the driving transistor T0, the active layer of the second transistor T2, the active layer of the first transistor T1, the active layer of the sixth transistor T6, the active layer of the seventh transistor T7, and the active layer of the eighth transistor T8 are formed by continuous semiconductor layers.

As shown in FIG. 13, the channel 80 of T8 and the channel 40 of T4 are arranged along the first direction; the channel of T5 and the channel 10 of T1 are arranged along the first direction; the first channel 310 of T3 and the channel 20 of T2 are arranged along the first direction, and the channel 70 of T7 and the channel of T6 are arranged along the first direction;

The channel 40 of T4, the channel 50 of T5 and the channel do of T0 are arranged in sequence along the second direction;

The channel 10 of T1, the channel 20 of T2 and the channel 60 of T6 are arranged in sequence along the second direction;

The first direction intersects the second direction.

In at least one embodiment of the present disclosure, the first direction may be a horizontal direction, and the second direction may be a vertical direction, but not limited thereto.

As shown in FIG. 14, the one labeled G1 is the gate electrode of the first transistor T1, the one labeled G2 is the gate electrode of the second transistor T2, and the one labeled G31 is the first gate electrode of the third transistor T3, the one labeled G32 is the second gate electrode of the third transistor T3, the one marked G4 is the gate electrode of the fourth transistor T4, the one marked G5 is the gate electrode of the fifth transistor T5, the one marked G6 is the gate electrode of the sixth transistor T6, the one labeled G7 is the gate electrode of the seventh transistor T7, the one labeled G8 is the gate electrode of the eighth transistor T8, the one labeled C2a is the first electrode plate of the second capacitor C2, and the first electrode plate C2a of the second capacitor C2 is multiplexed as the gate electrode of the driving transistor T0.

As shown in FIG. 14, the reset control line R1, the data writing-in control line GA1, the compensation control line GA2 and the light emitting control line E1 all extend along the first direction, but not limited thereto.

As shown in FIG. 15, the one labeled 12 is the second initial voltage line, and the one labeled C2b is the second electrode plate of the second capacitor C2, and the second electrode plate C2b of the second capacitor C2 is multiplexed as the first electrode plate C1b of the first capacitor C1.

As shown in FIG. 15, the second initial voltage line 12 extends along the first direction, but not limited thereto.

As shown in FIGS. 13-19, the drain electrode D6 of the sixth transistor T6 is multiplexed as the first electrode plate of the first capacitor C1.

As shown in FIGS. 13-19, the second electrode plate C2b of the second capacitor C2 is electrically connected to the power supply voltage line Vd through a via hole.

In FIG. 16, the one marked S1 is the source electrode of the first transistor T1, the one marked S4 is the source electrode of the fourth transistor T4, the one marked S8 is the source electrode of the eighth transistor T8, and the one marked D5 is the drain electrode of the fifth transistor T5, the one labeled D6 is the drain electrode of the sixth transistor T6, and the one labeled D7 is the drain electrode of the seventh transistor T7. In FIG. 14, the one marked I1 is the first initial voltage line, the one marked Vd is the power supply voltage line, and the one marked DS is the data line.

Figure 17:
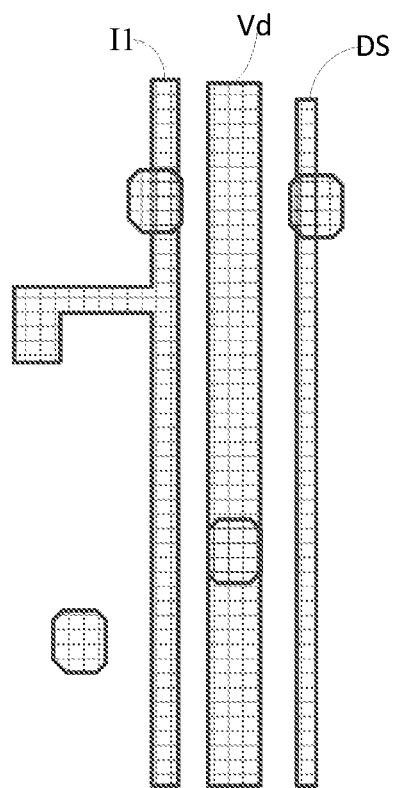
FIG. 17 is a layout diagram of the second source-drain metal layer in FIG. 18.

As shown in FIG. 17, the first initial voltage line I1, the power supply voltage line Vd and the data line DS all extend along the second direction, but not limited thereto.

As shown in FIG. 13-FIG. 19, S1 is electrically connected to the data line DS through a via hole, S4 is electrically connected to the first initial voltage line I1 through a via hole, S8 is electrically connected to the second initial voltage line 12 through a via hole, and D5 is electrically connected to the first electrode plate C2a of C2 through a via hole, and D6 is electrically connected to the power supply voltage line Vd through a via hole.

Figure 18:
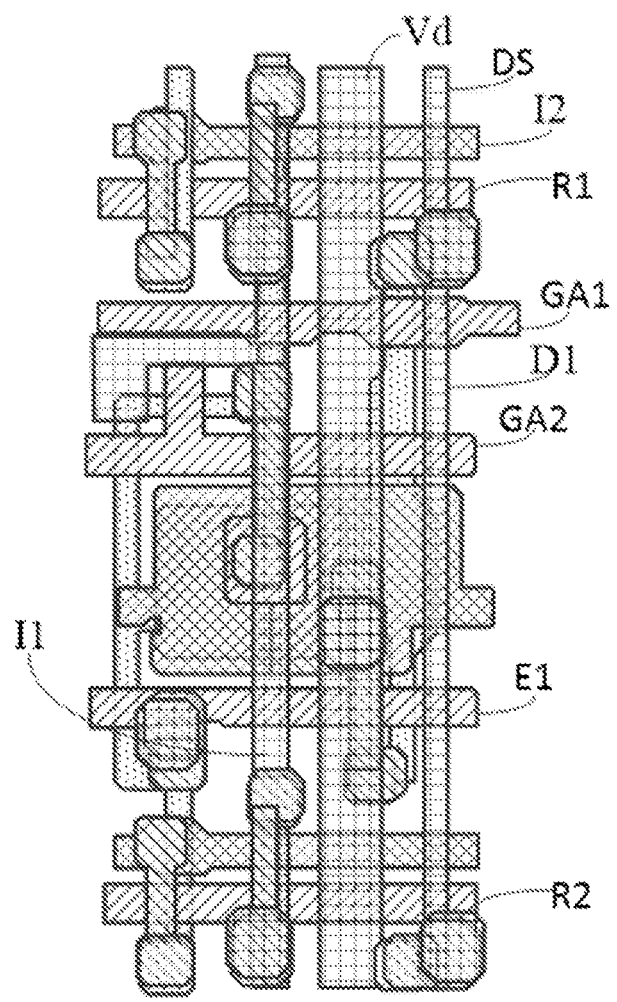
FIG. 18 is a schematic layout diagram of the shift register unit shown in FIG. 8.
Figure 19:
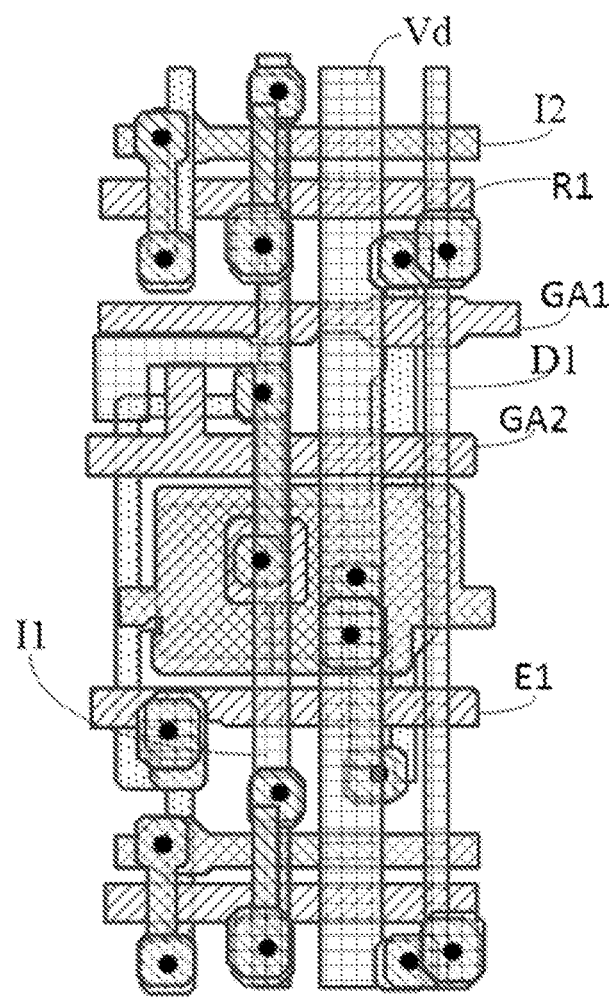
FIG. 19 is a schematic diagram of via holes added on the basis of FIG. 18.

FIG. 18 is a schematic layout diagram corresponding to the shift register unit shown in FIG. 8; FIG. 13 is a layout diagram of the active layer in FIG. 18, and FIG. 14 is a layout diagram of the first gate metal layer in FIG. 18, FIG. 15 is a layout diagram of the second gate metal layer in FIG. 18, FIG. 16 is a layout diagram of the first source-drain metal layer in FIG. 18, and FIG. 17 is a layout diagram of the second source-drain metal layer in FIG. 18, FIG. 19 is a schematic diagram of adding via holes on the basis of FIG. 18.

In specific implementation, the display substrate in the display device according to the embodiments of the present disclosure may include an active layer, a first gate metal layer, a second gate metal layer, a first source-drain metal layer and a second gate metal layer sequentially arranged on the base substrate, but not limited thereto.

In at least one embodiment of the present disclosure, the part of the active layer located on both sides of the channel of each transistor may be a conductive part, and the conductive part may be used as the first electrode of each transistor or the second electrode of each transistor, Alternatively, the conductive part may be electrically connected to the first electrode of each transistor or the second electrode of each transistor. Wherein, the first electrode can be a source electrode, and the second electrode can be a drain electrode; or, the first electrode can be a drain electrode, and the second electrode can be a source electrode; but not limited thereto.

In at least one embodiment of the present disclosure, the drain electrode of the seventh transistor T7 is electrically connected to the anode of the organic light emitting diode through a via hole, and the anode of the organic light emitting diode is located on a side of the second source-drain metal layer away from the base substrate.

Compared with at least one embodiment of the pixel driving circuit shown in FIG. 8, the fifth transistor T5 is removed in at least one embodiment of the pixel driving circuit shown in FIG. 110. When performing the layout of the pixel driving circuit as shown in FIG. 10, in the layout diagram shown in FIG. 18, T5 is not arranged.

As shown in FIGS. 13-19, compared with the related layout diagrams of the conventional pixel driving circuits, although the pixel driving circuit in the driving circuit described in at least one embodiment of the present disclosure increases the number of transistors, the layout diagram of the pixel driving circuit is still very simple and does not increase the layout difficulty.

The driving method described in the embodiments of the present disclosure is used to drive the driving circuit described in at least one embodiment of the present disclosure, and the driving method described in the embodiments of the present disclosure may include:

Providing a compensation control signal, a data writing-in control signal and a reset control signals to at least three adjacent rows of pixel driving circuits through the driving signal output terminals of at least one stage of the scanning driving circuit included in the driving circuit.

In the driving method described in the embodiments of the present disclosure, by partially overlapping among driving signals outputted by driving signal output terminals of adjacent stages of scanning driving circuits, the driving signal outputted by the current stage of the scanning driving circuit is used as the compensation control signal, the data writing-in control signal and the reset control signal provided to the adjacent at least three rows of pixel driving circuits, in this way, which not only ensures that the frame size of the display panel does not increase, and but also increases the compensation time of each row of pixel driving circuits, reduces the risk of mura (display unevenness), and doubles the display frequency frame when the compensation time is the same as that of the existing solution, greatly improves the display quality.

The display device described in the embodiments of the present disclosure includes the driving circuit described in at least one embodiment of the present disclosure.

In at least one embodiment of the present disclosure, the display device may further include a display substrate, the pixel driving circuit included in the driving circuit may be arranged in the display area of the display substrate, and the scanning driving module included in the driving circuit may be arranged in the peripheral area of the display substrate.

The display device provided by the embodiments of the present disclosure may be any product or component with a display function, such as a mobile phone, a tablet computer, a television, a monitor, a notebook computer, a digital photo frame, a navigator, and the like.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A driving circuit, comprising a plurality of stages of scanning driving circuits and a plurality of rows of pixel driving circuits;

wherein at least one stage of scanning driving circuit includes a driving signal output terminal, and the driving signal output terminal is electrically connected to at least three adjacent rows of pixel driving circuits in the plurality of rows of pixel driving circuits, and is configured to provide a compensation control signal, a data writing-in control signal and a reset control signal to the at least three adjacent rows of pixel driving circuits;

wherein the driving circuit includes N+2 stages of scanning driving circuits and N rows of pixel driving circuits; N is an integer greater than 1;

an nth stage of driving signal output terminal of an nth stage of scanning driving circuit included in the driving circuit is respectively electrically connected to an (n−2)th row of pixel driving circuit, an (n−1)th row of pixel driving circuit and an nth row of pixel driving circuit, the nth stage of scanning driving circuit is configured to provide the compensation control signal to the (n−2)th row of pixel driving circuit, provide the data writing-in control signal to the (n−1)th row of pixel driving circuit and provide the reset control signal to the nth row of pixel driving circuit through the nth stage of driving signal output terminal;

n is a positive integer, n is greater than 2, and n is less than N+1;

wherein, a first stage of driving signal output terminal of a first stage of scanning driving circuit included in the driving circuit is electrically connected to a first row of pixel driving circuit, and the first stage of scanning driving circuit is configured to providing the reset control signal to the first row of pixel driving circuit through the first stage of driving signal output terminal;

an (N+2)th stage of driving signal output terminal of an (N+2)th stage of scanning driving circuit included in the driving circuit is electrically connected to the Nth row of pixel driving circuit, and the (N+2)th stage of scanning driving circuit is configured to provide the compensation control signal to the Nth row of pixel driving circuit through the (N+2)th stage of driving signal output terminal.

2. The driving circuit according to claim 1, wherein a second stage of driving signal output terminal of a second stage of scanning driving circuit included in the driving circuit is respectively electrically connected to a first row of pixel driving circuit and a second row of pixel driving circuit, and the second stage of scanning driving circuit is configured to provide the data writing-in control signal to the first row of the pixel driving circuit, and provide the reset control signal to the second row of pixel driving circuit through the second stage of driving signal output terminal;

an (N+1)th stage of driving signal output terminal of an (N+1)th stage of scanning driving circuit included in the driving circuit is electrically connected to an (N−1)th row of pixel driving circuit and an Nth row of pixel driving circuit respectively, and the (N+1)th stage of scanning driving circuit is configured to provide the compensation control signals to the (N−1)th row of pixel driving circuit and provide the data writing-in control signal to the Nth row of pixel driving circuit through the (N+1)th stage of driving signal output terminal.

3. The driving circuit according to claim 1, wherein the pixel driving circuit comprises a driving sub-circuit, a data writing-in sub-circuit, a compensation sub-circuit, a first energy storage sub-circuit and a second energy storage sub-circuit;

the data writing-in sub-circuit is electrically connected to a data writing-in control line, a compensation control line, a data line, and a first end of the driving sub-circuit, respectively, is configured to write a data voltage provided by the data line into the first end of the driving sub-circuit under the control of the data writing-in control signal provided by the data writing-in control line and the compensation control signal provided by the compensation control line;

the compensation sub-circuit is electrically connected to the compensation control line, a control end of the driving sub-circuit, and a second end of the driving sub-circuit, is configured to control to connect the control end of the driving sub-circuit and the second end of the driving sub-circuit under the control of the compensation control signal;

the first energy storage sub-circuit is electrically connected to the first end of the driving sub-circuit for storing electric energy;

the second energy storage sub-circuit is electrically connected to the control end of the driving sub-circuit for storing electric energy.

4. The driving circuit according to claim 3, wherein the pixel driving circuit further comprises a reset sub-circuit;

the reset sub-circuit is electrically connected to the data writing-in control line, the reset control line, a first initial voltage line and the control end of the driving sub-circuit respectively, and is configured to write a first initial voltage provided by the first initial voltage line into the control end of the driving sub-circuit under the control of the data writing-in control signal and the reset control signal provided by the reset control line.

5. The driving circuit according to claim 3, wherein the pixel driving circuit further comprises a reset sub-circuit;

the reset sub-circuit is electrically connected to the reset control line, a first initial voltage line and the control end of the driving sub-circuit respectively, and is configured to write a first initial voltage provided by the first initial voltage line into the control end of the driving sub-circuit under the control of the reset control signal provided by the reset control line.

6. The driving circuit according to claim 3, wherein the pixel driving circuit further comprises a first light emitting control sub-circuit, a second light emitting control sub-circuit and an initialization sub-circuit;

the first light emitting control sub-circuit is electrically connected to a light emitting control line, a power supply voltage line and the first end of the driving sub-circuit respectively, and is configured to control to connect the power supply voltage line and the first end of the driving sub-circuit under the control of a light emitting control signal provided by the light emitting control line;

the second light emitting control sub-circuit is electrically connected to the light emitting control line, the second end of the driving sub-circuit and a first electrode of the light emitting element, and is configured to control to connect the second end of the driving sub-circuit and the first electrode of the light emitting element, and connect a second electrode of the light emitting element and a first voltage terminal under the control of the light emitting control signal;

the initialization sub-circuit is respectively electrically connected to the data writing-in control line, a second initial voltage line and the first electrode of the light emitting element, and is configured to write a second initial voltage provided by the second initial voltage line into the first electrode of the light emitting element under the control of the data writing-in control signal.

7. The driving circuit according to claim 3, wherein the data writing-in sub-circuit includes a first transistor and a second transistor; the compensation sub-circuit includes a third transistor;
   a control electrode of the first transistor is electrically connected to the data writing-in control line, a first electrode of the first transistor is electrically connected to the data line, and a second electrode of the first transistor is electrically connected to a first electrode of the second transistor;
   a control electrode of the second transistor is electrically connected to the compensation control line, and a second electrode of the second transistor is electrically connected to the first end of the driving sub-circuit;
   a control electrode of the third transistor is electrically connected to the compensation control line, a first electrode of the third transistor is electrically connected to the control end of the driving sub-circuit, and a second electrode of the third transistor is electrically connected to the second end of the driving sub-circuit;
   the first energy storage sub-circuit includes a first capacitor;
   a first electrode plate of the first capacitor is electrically connected to the first end of the driving sub-circuit, and a second electrode plate of the first capacitor is electrically connected to the power supply voltage line.

8. The driving circuit according to claim 4, wherein the reset sub-circuit includes a fourth transistor and a fifth transistor;
   a control electrode of the fourth transistor is electrically connected to the reset control line, a first electrode of the fourth transistor is electrically connected to the first initial voltage line, and a second electrode of the fourth transistor is electrically connected to a first electrode of the fifth transistor;
   a control electrode of the fifth transistor is electrically connected to the data writing-in control line, and a second electrode of the fifth transistor is electrically connected to the control end of the driving sub-circuit.

9. The driving circuit according to claim 5, wherein the reset sub-circuit includes a fourth transistor;
   a control electrode of the fourth transistor is electrically connected to the reset control line, a first electrode of the fourth transistor is electrically connected to a first initial voltage line, and a second electrode of the fourth transistor is electrically connected to the control end of the driving sub-circuit.

10. The driving circuit according to claim 6, wherein the first light emitting control sub-circuit includes a sixth transistor, the second light emitting control sub-circuit includes a seventh transistor, the initialization sub-circuit includes an eighth transistor, and the driving sub-circuit includes a driving transistor, the second energy storage sub-circuit includes a second capacitor;
   a control electrode of the sixth transistor is electrically connected to the light emitting control line, a first electrode of the sixth transistor is electrically connected to the power supply voltage line, and a second electrode of the sixth transistor is electrically connected to a first electrode of the driving transistor;
   a control electrode of the seventh transistor is electrically connected to the light emitting control line, a first electrode of the seventh transistor is electrically connected to a second electrode of the driving transistor, and a second electrode of the seventh transistor is electrically connected to a first electrode of the light emitting element;
   a control electrode of the eighth transistor is electrically connected to the data writing-in control line, a first electrode of the eighth transistor is electrically connected to a second initial voltage line, and a second electrode of the eighth transistor is electrically connected to the first electrode of the light emitting element;
   a first electrode plate of the second capacitor is electrically connected to a control electrode of the driving transistor, and a second electrode plate of the second capacitor is electrically connected to the power supply voltage line.

11. The driving circuit according to claim 1, further comprising N rows of reset control lines, N rows of data writing-in control lines, and N rows of compensation control lines; the reset control lines, the data writing-in control lines and the compensation control lines all extending along a first direction, wherein
   the pixel driving circuit included in the driving circuit is electrically connected to a corresponding row of reset control line, a corresponding row of data writing-in control line and a corresponding row of compensation control line;
   each row of reset control line, each row of the data writing-in control line, and each row of the compensation control line extend to a peripheral area along the first direction, and in the peripheral area, an nth row of reset control line in, an (n−1)th row of data writing-in control line and an (n−2)th row of compensation control line are electrically connected;
   n is a positive integer, n is greater than 2, and n is less than N+1; N is an integer greater than 1.

12. The driving circuit according to claim 11, wherein, in the peripheral area, a first row of data writing-in control line is electrically connected to a second row of reset control line, and an Nth row of data writing-in control line is electrically connected to an (N−1)th row of the compensation control line.

13. The driving circuit according to claim 11, further comprising N rows of light emitting control lines, wherein the pixel driving circuit included in the driving circuit is electrically connected to a corresponding row of light emitting control line;
   each row of pixel driving circuit includes a first transistor, a second transistor, a third transistor, a fourth transistor, a fifth transistor, a sixth transistor, a seventh transistor, an eighth transistor, a first capacitor and a second capacitor;
   a gate electrode of the fourth transistor and the corresponding row of reset control line form an integrated structure; a gate electrode of the eighth transistor and a next row of reset control line adjacent to the corresponding row of reset control line form an integrated structure;
   a gate electrode of the first transistor, a gate electrode of the fifth transistor and the corresponding row of data writing-in control line form an integrated structure;
   a first gate electrode of the third transistor, a second gate electrode of the third transistor, a gate electrode of the second transistor and the corresponding row of compensation control line form an integrated structure;

a gate electrode of the sixth transistor, a gate electrode of the seventh transistor and the corresponding row of light emitting control line form an integrated structure;

a gate electrode of the driving transistor is arranged between the corresponding row of compensation control line and the corresponding row of light emitting control line; the gate electrode of the driving transistor is multiplexed as a first electrode plate of the second capacitor; a second electrode plate of the second capacitor is multiplexed as a second electrode plate of the first capacitor; a drain electrode of the sixth transistor is multiplexed as a first electrode plate of the first capacitor;

the corresponding row of reset control line, the corresponding row of data writing-in control line, the corresponding row of compensation control line and the corresponding row of light emitting control line electrically connected to a same row of pixel driving circuits are arranged in sequence along a second direction;

the first direction intersects the second direction.

14. The driving circuit according to claim 13, wherein an active layer of the fourth transistor, an active layer of the fifth transistor, an active layer of the third transistor, an active layer of the driving transistor, an active layer of the second transistor, an active layer of the first transistor, an active layer of the sixth transistor, an active layer of the seventh transistor, and an active layer of the eighth transistor are formed by a continuous semiconductor layer;

a channel of the fourth transistor, a channel of the fifth transistor and a channel of the driving transistor are arranged in sequence along the second direction;

a channel of the first transistor, a channel of the second transistor and a channel of the sixth transistor are arranged in sequence along the second direction.

15. The driving circuit according to claim 13, further comprising N rows of second initial voltage lines, wherein the pixel driving circuit included in the driving circuit is electrically connected to a corresponding row of second initial voltage line; the second initial voltage line and the second electrode plate of the second capacitor are arranged at a same layer;

an orthographic projection of the corresponding row of second initial voltage line on the base substrate is located on a side of an orthographic projection of the corresponding row of reset control line on the base substrate away from an orthographic projection of the corresponding row of data writing-in control line on the base substrate.

16. A driving method for driving the driving circuit according to claim 1, comprising:

providing, by of at least one stage of the scanning driving circuit included in the driving circuit, the compensation control signal, the data writing-in control signal and the reset control signals to the at least three adjacent rows of pixel driving circuits through the driving signal output terminal.

17. A display device comprising the driving circuit according to claim 1.

18. The display device according to claim 17, further comprising a display substrate, wherein the pixel driving circuit included in the driving circuit is arranged in a display area of the display substrate, and the scanning driving circuit included in the driving circuit is arranged in a peripheral area of the display substrate.

* * * * *